(12) United States Patent
Yamanaka et al.

(10) Patent No.: US 7,667,559 B2
(45) Date of Patent: Feb. 23, 2010

(54) SWITCH, SEMICONDUCTOR DEVICE, AND MANUFACTURING METHOD THEREOF

(75) Inventors: Kiyoko Yamanaka, Kokubunji (JP); Yasushi Goto, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 140 days.

(21) Appl. No.: 11/472,355

(22) Filed: Jun. 22, 2006

(65) Prior Publication Data

US 2007/0018761 A1 Jan. 25, 2007

(30) Foreign Application Priority Data

Jul. 22, 2005 (JP) ............................. 2005-212243

(51) Int. Cl.
 *H01H 51/22* (2006.01)
(52) U.S. Cl. ........................................ 335/78; 200/181
(58) Field of Classification Search ................... 335/78; 200/181
 See application file for complete search history.

(56) References Cited

U.S. PATENT DOCUMENTS

| | | | | |
|---|---|---|---|---|
| 3,560,807 | A * | 2/1971 | Urfer et al. ................. | 361/434 |
| 6,876,482 | B2 * | 4/2005 | DeReus ....................... | 359/290 |
| 6,972,650 | B2 * | 12/2005 | Ma .............................. | 335/78 |
| 7,064,637 | B2 * | 6/2006 | Tactic-Lucic et al. ......... | 335/78 |
| 7,164,334 | B2 * | 1/2007 | Shirakawa ................... | 335/78 |
| 2003/0132433 | A1 * | 7/2003 | Piner et al. .................... | 257/19 |
| 2004/0140872 | A1 * | 7/2004 | Wong ........................... | 335/78 |

FOREIGN PATENT DOCUMENTS

JP 2001-067964 8/1999

OTHER PUBLICATIONS

Han-Sheng Lee et al., "Integrated Microrelays:Concept and Initial Results", Journal of Microelecromechanical Systems., vol. 11, No. 2, Apr. 2002, pp. 147-153.

* cited by examiner

*Primary Examiner*—Elvin G Enad
*Assistant Examiner*—Bernard Rojas
(74) *Attorney, Agent, or Firm*—Stites & Harbison PLLC; Juan Carlos A. Marquez, Esq.

(57) ABSTRACT

It is an objective to achieve a MEMS switch which can be mounted with a CMOS circuit and has a contact point with high reliability, both mechanically and electrically. An insulator having a compatibility with a CMOS process is formed at the contact surface of a cantilever beam constituting a MEMS switch and a fixed contact 2 opposite thereto. When the switch is used the cantilever beam is moved by applying a voltage to the pull-in electrode and the cantilever beam. After the cantilever beam makes contact with the fixed contact, a voltage exceeding the breakdown field strength of the insulator is applied to the insulator, resulting in dielectric breakdown occurring. By modifying the insulator once, the mechanical fatigue concentration point of the switch contact point is protected, and a contact point is achieved as well in which electrical signals are transmitted through the current path formed by the dielectric breakdown.

12 Claims, 24 Drawing Sheets

| DIELECTRIC MATERIALS | UNDERLAYER MATERIALS | BREAKDOWN VOLTAGE | BREAKDOWN FIELD STRENGTH |
|---|---|---|---|
| $Al_2O_5$ | TiN | 14.9V | 1V/nm |
| $SiO_2$ | TiN | 2.9V | 0.2V/nm |
| $Ta_2O_5$ | TiN | 4.0V | 0.26V/nm |
| $Nb_2O_5$ | TiN | 5.5V | 0.36V/nm |

SWITCH, SEMICONDUCTOR DEVICE, AND MANUFACTURING METHOD THEREOF

CLAIM OF PRIORITY

The present application claims priority from Japanese application JP 2005-212243 filed on Jul. 22, 2005, the content of which is hereby incorporated by reference into this application.

FIELD OF INVENTION

The present invention relates to a semiconductor device and a manufacturing method thereof, specifically, relates to a switch where the life-time is increased by improving the electrical and mechanical reliability of an electrical contact point.

BACKGROUND OF THE INVENTION

A new functional device in which a CMOS circuit and a MEMS part are brought together will be achieved by the advancement of semiconductor processing technology and extension of micro-machining technology, so-called MEMS (Micro-Electro-Mechanical Systems) technology. For instance, it is thought that the switching function to switch a re-configurable logic device is carried out by using a MEMS switch.

A re-configurable logic device or a programmable logic device (PLD) is a flexible LSI in which a plurality of circuit configurations selectable by the user have been readied on a chip and operations, such as an addition function and a changing function, are achieved by freely switching the circuit configuration after the user has purchased a completed chip. There are merits on the user side, such as shortening the development time and cost reductions. When the machining size is decreased to 65 nm by improvements in semiconductor process technology, it is said that the market development of a PLD core will be accelerated more since problems of the area efficiency and cost can be solved even if generic logic is mounted on a chip. However, the problems of quality and power consumption of the entire chip still remain.

If the change of the circuit configuration of this re-configurable logic device can be achieved by a MEMS switch which is simultaneously formed with a circuit element by using a CMOS process, the problem of power consumption can be solved without a significant price increase. Since electrical signals in a MEMS switch are transmitted by the contacting of mechanical elements with each other which are composed of a metallic material, the parasitic resistance is small during an ON operation. Therefore, if it is simultaneously manufactured with a CMOS circuit element, it can be achieved by adding a few steps to the existing circuit process. However, on the other hand, in order to achieve the practical use of a MEMS switch, the problem still remains in the reliability of the contact terminal part which transmits the electrical signals.

A MEMS switch formed by using a conventional semiconductor process is like the one, in general, shown in FIG. 1 (for instance, refer to JOURNAL OF MICROELECTROMECHANICAL SYSTEMS, VOL. 11, NO. 2, APRIL 2002 147 "Integrated Microrelays: Concept and Initial Results" Han-Sheng Lee et al.). The MEMS switch shown in FIG. 1 moves a cantilever beam (cantilever contact arm) 101 by a pull-in electrode (driving mechanism) 102 and lets a fixed contact (fixed contact arm) 103 opposite the cantilever beam 101 physically contact the cantilever beam 101, resulting in the switch being opened and closed. Therefore, a low resistivity metal such as Au and Cu is used for a metallic material comprising the cantilever beam 101 and the fixed contact 103 and, for instance, they are fabricated by using a vacuum evaporation technique, plating technique, and a sputtering technique.

When such a MEMS switch is used in practice, there is a problem that metals comprising the contacts become welded to each other during the switching action of the switch. Concerning this problem, in JP-A No. 67964/2001, welding and dislocation are prevented without increasing the contact resistance by forming a high melting point metal with high hardness or a super-ultra thin film of an insulator at the contact terminal part of the switch, resulting in the avoidance of deterioration due to aging. In this technique, when the super-ultra thin film is an insulator, the signal is transmitted by a tunneling current flowing in the film.

SUMMARY OF THE INVENTION

In the case when a new functional LSI which combines a MEMS switch with a CMOS circuit is achieved, if it is designed by using a low resistance metal (or a metal with high oxidation resistance) for a contact point, such as Au which is used for a conventional MEMS switch, a new material, specifically a material influencing the element properties of the LSI, is introduced in a conventional CMOS process. In order to take the fabrication process of a MEMS switch in a general CMOS process manufacturing line and form it simultaneously with the fabrication of the CMOS circuit, it is necessary to achieve a structure which prevents the diffusion of these metallic elements, and there is attendant difficulty.

Moreover, even if one tries to introduce into a contact material of the MEMS switch a metal other than Au which is compatible with a CMOS process, for instance Ag etc., there is a case where a surface oxide film might be formed only by exposing the surface of the metal in an atmospheric gas including oxygen atoms, the contact resistance between the contact points being increased as a parasitic resistance, and the switching action of the switch being obstructed.

On the other hand, as disclosed in JP-A No. 67964/2001, there is a technology where a dielectric super-ultra thin film is formed for protecting the contact metal and the signal is transmitted due to a tunneling current through the super-ultra thin film. In this technology, the thickness of the super-ultra thin film while fabricating the switch is strictly defined, so that a problem with accuracy arises in the fabrication of a switch, which performs uniform signal transmission. The tunneling current has a dependency of $\exp(-t)$ with respect to the thickness, t, of the insulator. In the case when a contact point fabricated by using a method described in JP-A No. 67964/2001 is applied to a MEMS switch mounted with a CMOS circuit, the size of the switch body is assumed to be several micro-meters or less and the contact point to be a sub-micron size. When the insulator exhibits a difference in the film thickness of one angstrom, the value of the tunneling current flowing through the contact points will show a two-fold change. In a word, the amount of the current flowing to the contact points will change greatly and the controllability and reproducibility of a completed switch becomes lower if the film deposition cannot be controlled to an accuracy of ±0.5 angstroms when a MEMS switch is made.

It is an objective to achieve a MEMS switch which can be mounted with a CMOS circuit and have a contact point with high reliability both mechanically and electrically.

The aforementioned and other objectives and new features of the present invention will appear from the following description and the accompanying drawings of this specification.

The following are brief descriptions of outlines of typical examples in the inventions disclosed in the subject application.

A switch in the present invention is a switch which includes a cantilever beam and a fixed contact, contacts the cantilever beam to the fixed contact, and has an insulator formed on the contact surface between the cantilever beam and the fixed contact, in which a current path is formed by modification through the dielectric breakdown.

A semiconductor device of the present invention is a semiconductor device in which a switch including a cantilever beam and a fixed contact and contacting the cantilever beam to the fixed contact are formed together with a MISFET on the same semiconductor substrate. The switch has an insulator formed on the contact surface of the cantilever beam and the fixed contact and the insulator is one in which a current path is formed by modification through the dielectric breakdown.

Moreover, a manufacturing method of the present invention includes: (a) forming a MISFET over a semiconductor substrate, (b) forming an interlayer dielectric over the semiconductor substrate, (c) forming a first metal layer over the interlayer dielectric, (d) forming a first insulator over the first metal layer, (e) forming a beam support, a pull-in electrode, and a fixed contact by patterning the first metal layer and the first insulator, (f) forming a sacrificial layer to cover the beam support, the pull-in electrode, and the fixed contact, (g) forming an opening part reaching the first metal layer of the beam support in the sacrificial layer, and forming a second metal layer over the sacrificial layer including the opening part, (h) forming a cantilever beam connected to the beam support by patterning the second metal layer, (i) removing the sacrificial layer, (j) contacting the cantilever beam with the fixed contact by applying a voltage between the pull-in electrode and the cantilever beam, (k) applying a voltage between the cantilever beam and the fixed contact which is necessary for dielectrically breaking down the first insulator of the fixed contact.

The followings are brief descriptions of effects obtained by typical examples in the inventions disclosed in the subject application.

A MEMS switch can be achieved, which can be mounted with a CMOS circuit without introducing a new material that influences the operation characteristics of a LSI element in an existing CMOS process, and has a contact point with high reliability both mechanically and electrically.

DETAILED DESCRIPTION OF THE PREFERRED EMBODIMENTS

The embodiments will be described divided into a plurality of sections or embodiments hereinafter in the embodiments if it is necessary for convenience. However, they are not independent of each other and there is a relationship where one is a modification, detail, and supplementary explanation of a part of or all of another example, except for the case specifically expressed.

Furthermore, in the case of mentioning the amount of the element (including the number, the numerical value, the amount, and the range, etc.) in the following embodiments, it is not intended to be limited in the specific number and it may be more or less than the specific number, except for the case specifically expressed or the case when it is principally obviously limited to the specific number.

Moreover, in the following embodiments, it is needless to say that the component (including the element step etc.) is not an absolute necessity, except for the case specifically expressed or the case when it is considered that it is principally obviously necessary.

Similarly, in the case of mentioning the shape of the component and the position, etc. in the following embodiments, one being closely analogous or similar to the shape, etc., in practice, is included except for the case specifically expressed or the case when it is considered that it is not principally and obviously so. It is similar also for the aforementioned values and regions.

The embodiments of the present invention will be described in detail referring to the accompanying drawings. In all the figures for explaining the embodiments, the same code will be attached to the same component as a rule and repeating the explanation will be omitted. In order to make figures easy to see, hatching might be applied even if it is a plan drawing.

First Embodiment

Figure 1:
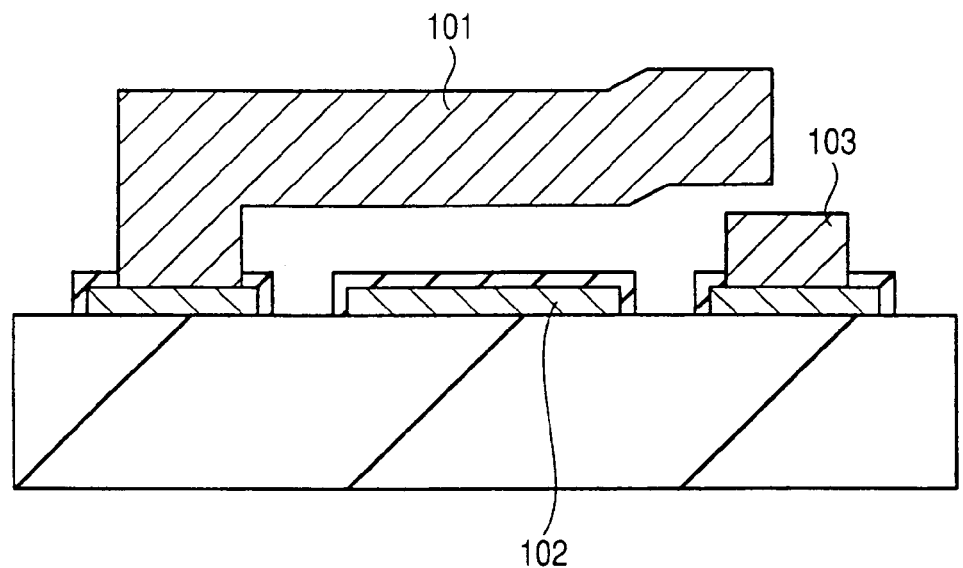
FIG. 1 is a cross-sectional drawing illustrating a configuration of a conventional MEMS switch.
Figure 2:
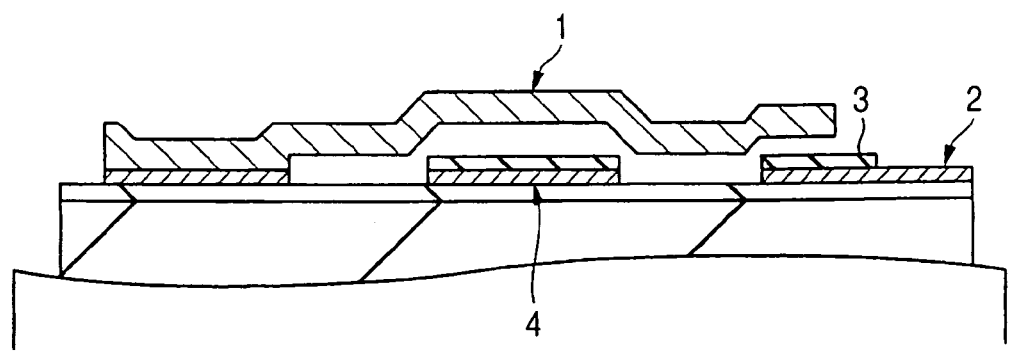
FIG. 2 is a cross-sectional drawing illustrating a configuration of a MEMS switch of the first embodiment in the present invention.

As shown in FIG. 2, the first embodiment describes a configuration consisted of an insulator 3 formed on the contact surface of a cantilever beam 1 constituting the MEMS switch and a fixed contact 2 opposite thereto. When the switch is used, the cantilever beam 1 is moved to contact the fixed contact 2 by applying a predetermined voltage between the cantilever beam 1 and a pull-in electrode 4, and a voltage exceeding the breakdown field strength of the insulator 3 is applied to the insulator 3, resulting in dielectric breakdown taking place. As mentioned above, by modifying the insulator 3 once, a contact point is achieved in which the contact point part of the switch which repeatedly makes contact is mechanically protected and the electrical signals are transmitted through the current path formed by the dialectric breakdown.

Conventionally, contact between the cantilever beam 1 and the fixed contact 2 constituting a switch has taken place by using a metal. However, since the metal is comparatively soft, mechanical fatigue is produced in the contact of the metal during repeated switching operations. For instance, the metal contacting parts become pitted, and the metal might not contact well with each other even if the switch is shut, resulting in contact failure occurring. Moreover, since the metal welded mutually, a failure occurred in which the switch remained shut. In addition, since an oxide formed on the surface of the metal, a failure occurred in which the contact resistance of the switch changed.

Then, in the first embodiment, the switch was not made ON by contacting the metal mutually but a modified insulator is formed on the contact surface between the cantilever beam 1 and the fixed contact 2 constituting the switch. As a result, the mechanical strength of the contact point part of the switch can be improved. Specifically, since the insulator 3 is harder than a metal, the mechanical fatigue can be reduced compared with a metal even if the switching operations are repeated. Moreover, although a metal is easy to weld mutually, the insulator 3 formed on the contact surface of the switch can prevent a metal from welding to each other in the first embodiment. Furthermore, since the modified insulator 3 is formed on the surface of the metal, the surface of the metal is not newly oxidized. Therefore, the change in the contact resistance of the switch can be controlled.

Herein, a question arises if a current will flow between the cantilever beam 1 and the fixed contact 2 when the insulator 3 is formed between the cantilever beam 1 and the fixed contact 2 which is to be contacted. However, it was found in the first embodiment that a current flows between the cantilever beam 1 and the fixed contact 2 by modifying the insulator 3 using the following technique. Specifically, the cantilever beam 1 and the fixed contact 2 contact each other and a voltage is applied to the gap between the cantilever beam 1 and the fixed contact 2, which is sufficient for dielectric breakdown of the insulator 3 formed on the contact surface of the cantilever beam 1 and the fixed contact 2. Then, dielectric breakdown occurs in the insulator 3. At this time, a current path is formed in the film and then current flows through this current path. Therefore, a current can flow between the cantilever beam 1 and the fixed contact 2 after modifying the insulator 3. In this specification, modification means that the dielectric breakdown occurs once in the insulator and a current path is formed in the film. In the first embodiment, the reliability of the switch can be improved due to the formation of a modified insulator on the contact surface of the switch. In other words, mechanical fatigue, welding and a change in the contact resistance caused by mutual contacting of metal can be controlled, and thereby the reliability of the ON/OFF operation of the switch can be improved.

We found that a current path is formed in the film when dielectric breakdown occurs once in a material which is generally used for a capacitor dielectric and an interlayer dielectric in a CMOS process, for instance, an oxide system ceramic film such as a $SiO_2$ (silicon oxide), an $Al_2O_5$ (aluminum oxide), a $Ta_2O_5$ (tantalum oxide), and a $Nb_2O_5$ (niobium oxide), etc. and a silicon nitride film, by applying an electric field of the breakdown field strength or more. In other words, it was found that the metallic resistance component could be observed between the electrodes through the insulator after dielectric breakdown.

Figure 3:
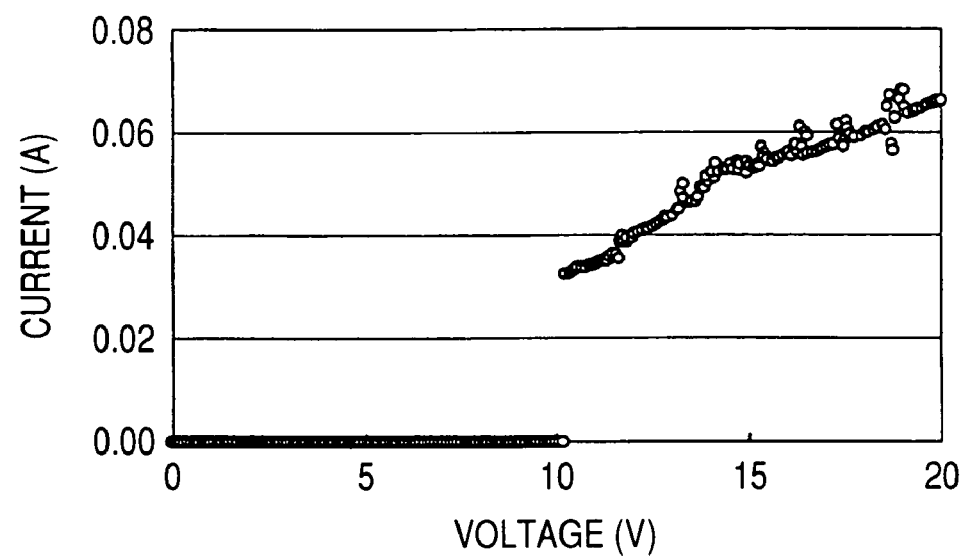
FIG. 3 is a diagram showing the current-voltage characteristic of an insulator when dielectric breakdown occurs once.
Figure 4:
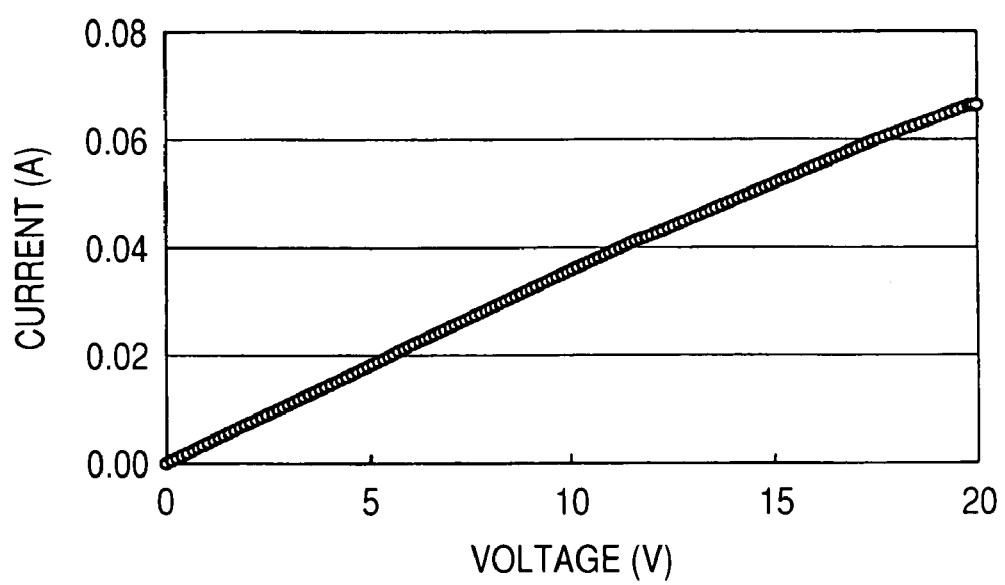
FIG. 4 is a diagram showing the current-voltage characteristic of an insulator after dielectric breakdown occurs.

FIGS. 3 and 4 are diagrams of voltage V–current I characteristics before and after the dielectric breakdown by applying a voltage between the upper terminal and a 15 nm thick aluminum oxide film, which is an insulator, deposited on the electrode. FIG. 3 is a diagram showing the voltage-current characteristics when dielectric breakdown occurs once, in the case when a 15 nm thick aluminum oxide film is deposited on the electrode composed of a polycrystalline silicon film. In FIG. 3, the vertical axis represents the current flowing between the electrodes and the horizontal axis represents the voltage applied between the electrodes. As shown in FIG. 3, since dielectric breakdown does not occur in the aluminum oxide film in the range from 0 V to about 10 V, it is understood that a current does not flow between the electrodes. Then, it is understood that dielectric breakdown occurs in the aluminum oxide film when the voltage exceeds about 10 V, and that ohmic current-voltage characteristics can be observed.

FIG. 4 is the case when a voltage is applied to the aluminum oxide film which dielectrically broke down once. As shown in FIG. 4, in the case when a voltage was applied to the aluminum oxide film which dielectrically broke down once, it is confirmed that the ohmic current-voltage characteristics could be observed even under a voltage of 10 V or less. Specifically, it was confirmed that a current could flow for a voltage of 10 V or less since the aluminum oxide which dielectrically broke down once was modified and a current path was formed in the film. At this time, it was confirmed that the resistance component generally showed the value of the polycrystalline silicon film used for the electrode and the resistance of the modified aluminum oxide film was low. In other words, it was confirmed that the electric resistance could be decreased by modifying the aluminum oxide film by dielectric breakdown and that ohmic current-voltage characteristics could be obtained as a switch which includes the electrode and the aluminum oxide film.

Figures 5, 6:
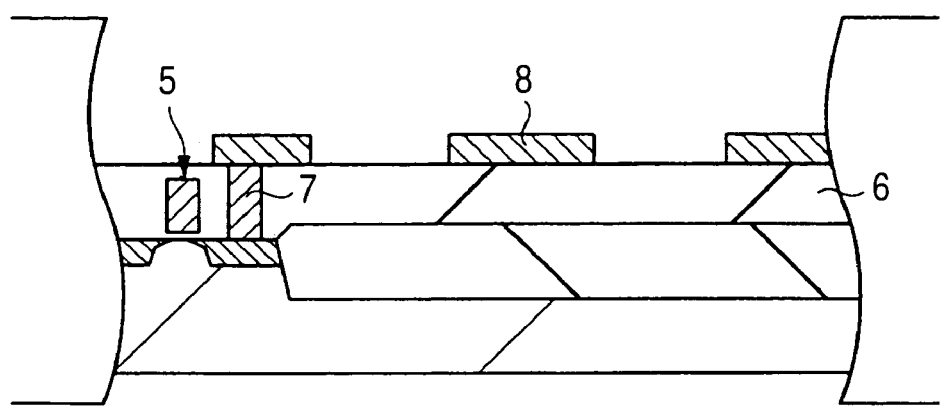
FIG. 5 is a table in which the relationship between the insulation material and the breakdown voltage is primarily shown.
FIG. 6 is a cross-sectional drawing illustrating a manufacturing process of a MEMS switch in the first embodiment.

Moreover, as shown in FIG. 5, it was understood that ohmic current-voltage characteristics could be obtained in the entire system (a system including an insulator and the underlayer material) even if the voltage is lower than the breakdown voltage of the insulator, when it is energized after the dielectric breakdown even if it is a combination of other materials. For instance, in the case when an approximately 15 nm thick aluminum oxide film deposited for a dielectric material by using a CVD technique is formed on a titanium nitride film to be an underlayer material (lower electrode), dielectric breakdown occurs at a breakdown voltage of 14.9 V, and current flow takes place after dielectric breakdown occurs once, even if the voltage is lower then the breakdown voltage. At this time, the current-voltage characteristics were ohmic in the entire system which includes an insulator and the underlayer material. Similarly, in the case when a silicon oxide film, a tantalum oxide film, or a niobium oxide film was formed on the titanium nitride film by using a sputtering technique, dielectric breakdown occurred at respective different voltages, and ohmic current-voltage characteristics were observed even under the breakdown voltage or less after dielectric breakdown occurred once. It is not shown in FIG. 5, but the same phenomenon can be observed even if it is a metal oxide of Ti, Ge, W, Hf, and Zn.

When a MEMS switch is manufactured by using a CMOS process (semiconductor micro-machining technique), a material used for a contact point of the switch is assumed to be a metal with low resistance having a compatibility with a conventional CMOS process and an insulator having a compatibility with a conventional CMOS process is deposited on the metallic contact surface for the contact point to protect the surface of the contact metal.

The maximum thickness tmax of the formed deposition film can be selected according to the material of the contact metal and the compatibility with the process, as required, and it is determined, as follows, by the breakdown field strength Eb of the insulator and the maximum voltage Vmax capable of being applied to the peripheral circuits in which the driving mechanism of the MEMS switch is provided.

$$t = V/Eb < tmax = 2 \times Vmax/Eb$$

That is, if the breakdown voltage V determined by the product of the thickness t of the insulator and the breakdown field strength Eb of the insulator, is assumed to be within twice of the maximum voltage Vmax capable of being applied to the driving circuits, the maximum thickness tmax of the insulator is decided by $2 \times Vmax/Eb$.

Moreover, the minimum thickness tmin of the formed deposition film becomes the lower limit value of the thickness of the extent where the insulator does not ruin the insulation performance and the tunneling current does not flow between the electrodes through the insulator. The preferable thickness, t, of the insulator is controlled to be from 1 nm to 100 nm, specifically, from 1 nm to 25 nm according to the breakdown field strength of the material generally used for the capacitor dielectric and an interlayer dielectric in a CMOS process and the maximum value of the voltage capable of generally being applied to a CMOS logic circuit, and the fabrication method of the insulator.

It is known that the breakdown field strength becomes almost the same value when the configuration of the insulator is determined, so that the voltage causing dielectric breakdown can be easily controlled according to the thickness of the insulator. The tunneling current has the dependency of $\exp(-t)$ with respect to the thickness of the insulator t. Since the voltage causing dielectric breakdown changes according to the thickness of the insulator t by $(1/t)$, the stipulation of the thickness of the insulator is not strict while fabricating a MEMS switch. Therefore, in the case when the signal route between the contact points is secured by the modification of the insulator utilizing the dielectric breakdown phenomenon, it is possible to manufacture a large amount of MEMS switches with little variation in the electrical characteristics.

In FIG. 2, although an example in which a modified insulator 3 is formed on the fixed contact 2 is shown, it is not intended to be limited thereto. For instance, a modified insulator 3 may be formed on a face of the cantilever beam 1 contacting the fixed contact 2 and a modified insulator 3 may be formed on the contact face of both the cantilever beam 1 and the fixed contact 2.

Next, a manufacturing method of a MEMS switch in the first embodiment will be described referring to the drawings.

Figure 7:
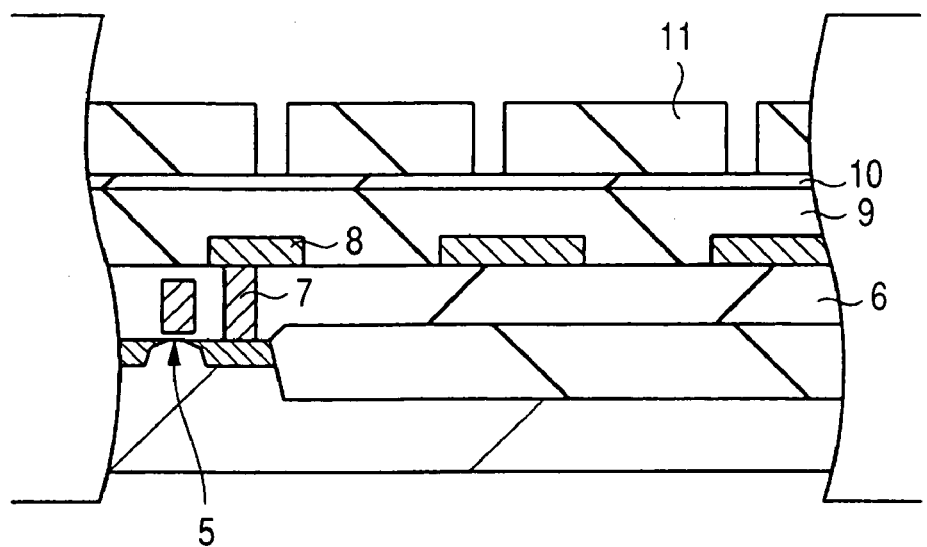
FIG. 7 is a cross-sectional drawing illustrating a manufacturing process of a MEMS switch following FIG. 6.

FIG. 6 shows a process while fabricating a MEMS switch at the upper layer of a semiconductor wafer on which a MISFET (Metal Insulator Semiconductor Field Effect Transistor) 5 is formed. The signal line 8 is connected to a MISFET 5 through the plug 7 embedded in an interlayer dielectric 6. From this state, as shown in FIG. 7, the interlayer dielectric 9 is deposited on the signal lines 8 and a covering layer 10 is deposited on the interlayer dielectric 9. Then, a photo resist 11 is formed for processing the covering layer 10 and the interlayer dielectric 9 by using a photolithography technique. The photo resist 11 is patterned so as not to leave any photo resist 11 in the region for forming the plug. Herein, a silicon nitride film is used for the covering layer 10.

Figure 8:
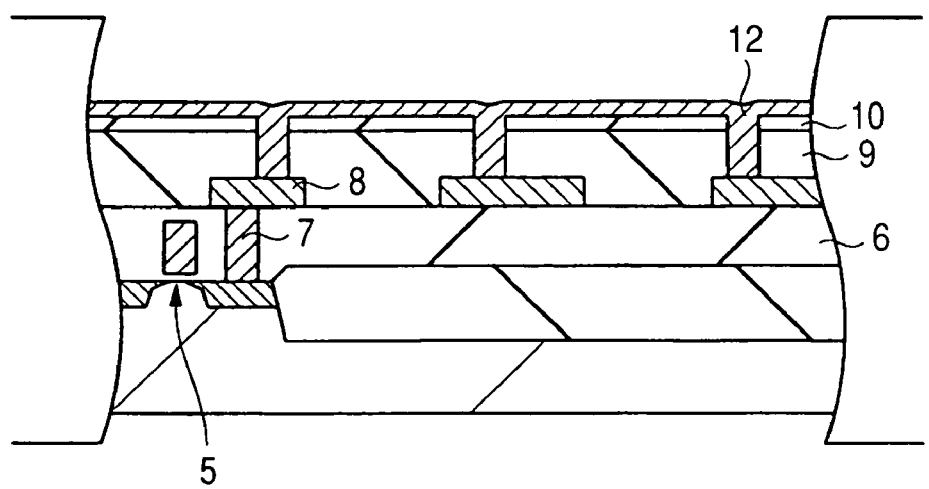
FIG. 8 is a cross-sectional drawing illustrating a manufacturing process of a MEMS switch following FIG. 7.
Figure 9:
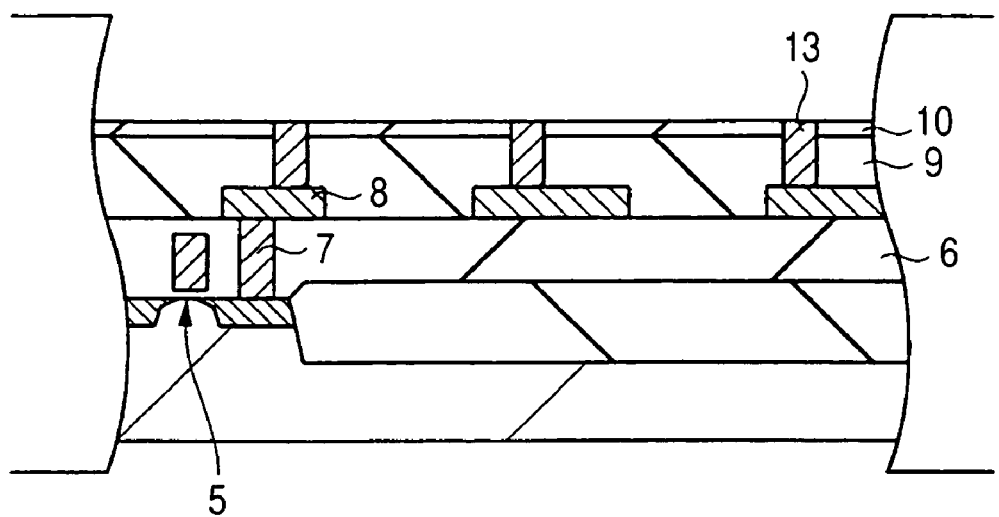
FIG. 9 is a cross-sectional drawing illustrating a manufacturing process of a MEMS switch following FIG. 8.

Next, an opening is formed in the covering layer 10 and the interlayer dielectric 9 by etching using the patterned photo resist 11 as a mask. The signal lines 8 are exposed at the bottom part of the opening at this time. Then, as shown in FIG. 8, a metal layer 12 which will be a plug for connecting to the signal lines 8 is deposited on the covering layer 10 which includes the formed opening. Afterward, as shown in FIG. 9, the plug 13 is formed by planarizing using, for instance, a CMP (Chemical Mechanical Polishing) technique.

Figure 10:
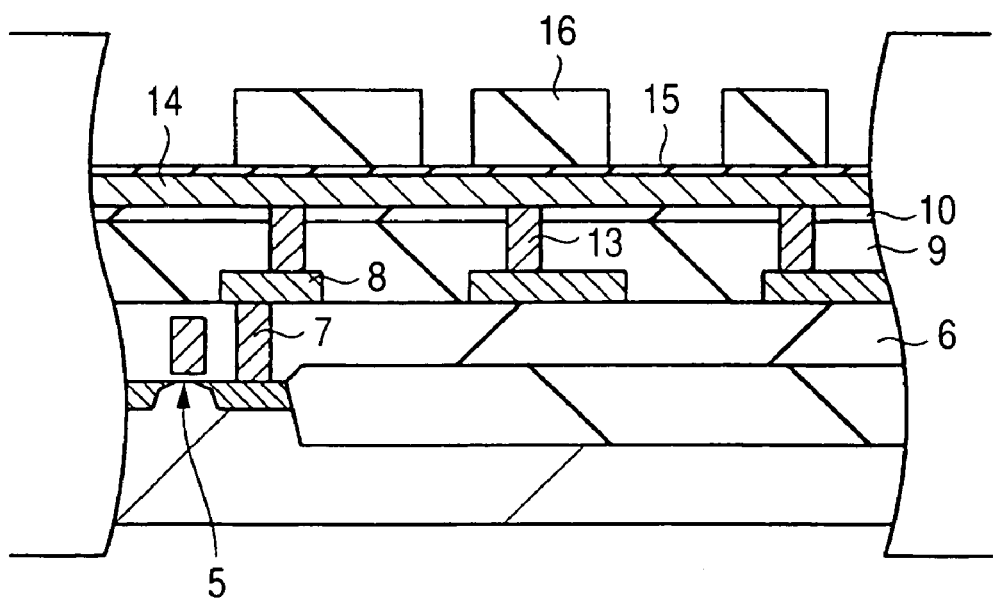
FIG. 10 is a cross-sectional drawing illustrating a manufacturing process of a MEMS switch following FIG. 9.

Next, as shown in FIG. 10, after forming the metal layer (first metal layer) 14 on the covering layer 10 on which the plug 13 is formed, the insulator (first insulator) 15 is formed on this metal layer 14 for protecting the metal layer 14. Annealing (heat treatment) is carried out for the insulator 15 after forming, for instance, by a CVD technique. This anneal is carried out for the purpose of sintering the insulator 15. By sintering the insulator 15, the insulator 15 becomes dense and the mechanical strength thereof can be improved. Herein, a conductive polysilicon film was used for the metal film 14 and an aluminum oxide (alumina) was used for the insulator 15 in order to protect it. Then, by using a photolithography technique, a patterned photo resist 16 is formed on the insulator 15. The photo resist 16 is patterned so that the photo resist 16 remains in the region where a beam support, a pull-in electrode, and a fixed contact of the MEMS switch are formed.

Figure 11:
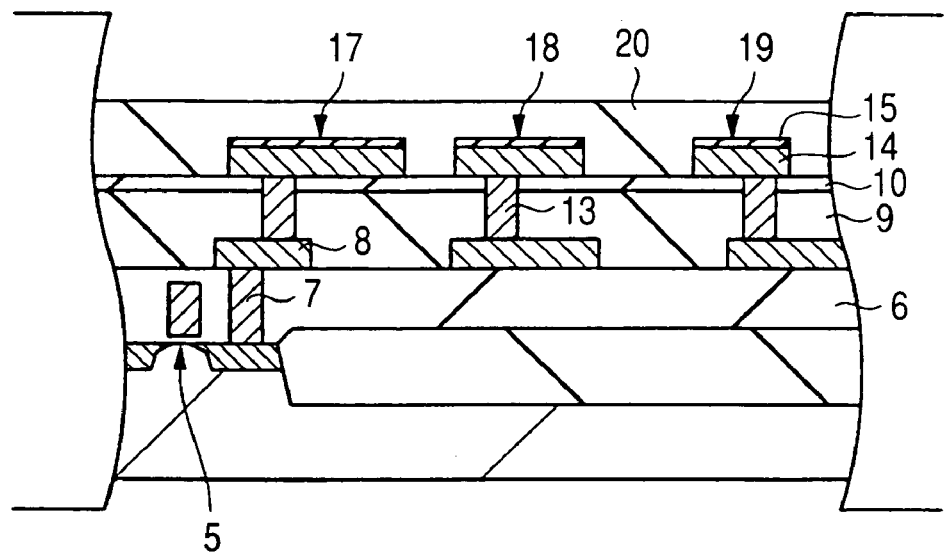
FIG. 11 is a cross-sectional drawing illustrating a manufacturing process of a MEMS switch following FIG. 10.

Then, a metal layer 14 and the insulator 15 are patterned by etching using the patterned photo resist 16 as a mask to form a beam support 17, a pull-in electrode 18, and a fixed contact 19 of the MEMS switch as shown in FIG. 11. Next, after cleaning the surface, a sacrificial layer 20 which will be gap in the MEMS switch is deposited. Herein, a plasma TEOS is used for the sacrificial layer 20.

Figure 12:
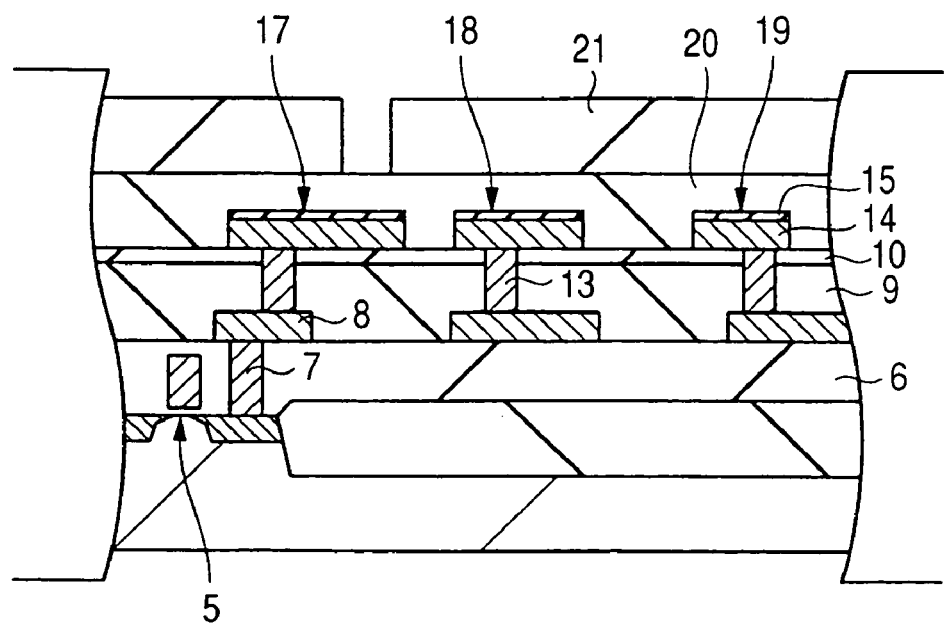
FIG. 12 is a cross-sectional drawing illustrating a manufacturing process of a MEMS switch following FIG. 11.

As shown in FIG. 12, a patterned photo resist 21 is formed on the sacrificial layer 20 by using a photolithography technique. The photo resist 21 is formed so that the photo resist 21 should not remain in the formation region for the opening which reaches the metal layer 14 constituting the beam support 17.

Figure 13:
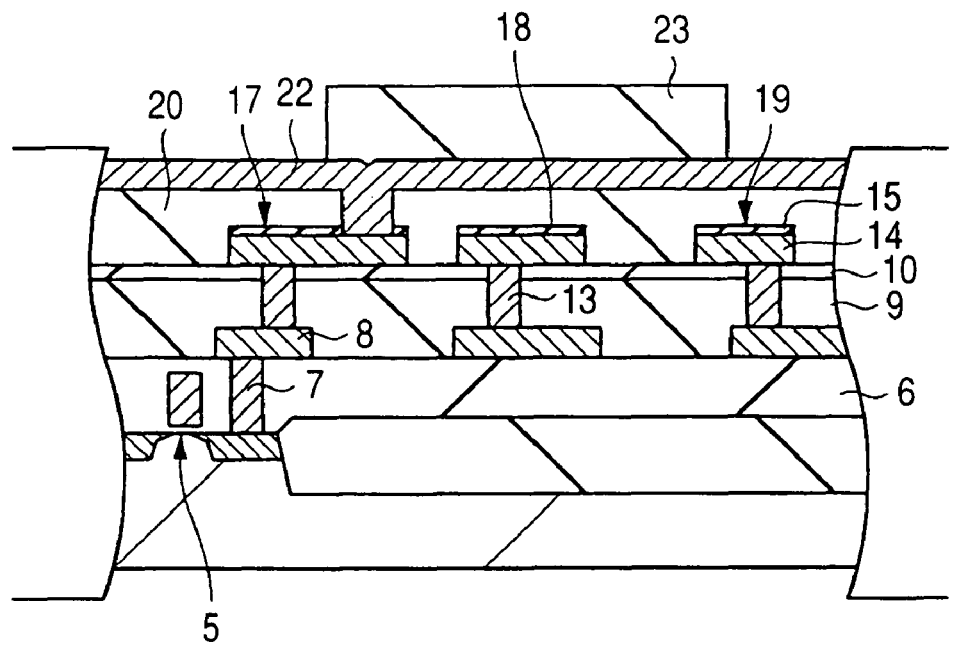
FIG. 13 is a cross-sectional drawing illustrating a manufacturing process of a MEMS switch following FIG. 12.
Figure 14:
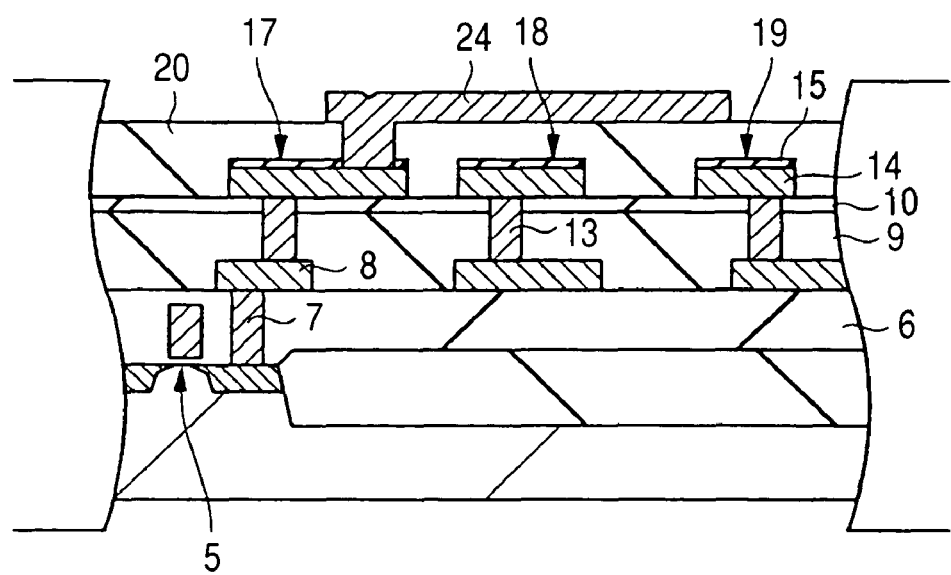
FIG. 14 is a cross-sectional drawing illustrating a manufacturing process of a MEMS switch following FIG. 13.

Next, an opening is formed in the sacrificial layer 20 by etching using a patterned photo resist 21 as a mask. This opening reaches the beam support 17 as shown in FIG. 13. Then, the insulator 15 constituting a part of the beam support 17 is also removed, and the metal layer 14 constituting the main part of the beam support 17 is exposed. After the surface is cleaned by removing the photo resist 20, a metal layer (second metal layer) 22 is formed on the sacrificial layer 20 which includes the opening which reaches the beam support 17. This metal layer 22 is composed of, for instance, a polysilicon film. After the photo resist 23 is coated on this metal layer 22, the photo resist 23 is patterned by using a photolithography technique. Patterning is carried out so that the photo resist 23 remains in the region where the cantilever beam is formed.

Next, by etching using the patterned photo resist 23 as a mask, the cantilever beam 24 connected to the beam support 17 is formed by patterning the metal layer 22. Afterwards, the photo resist 23 is removed.

Figure 15:
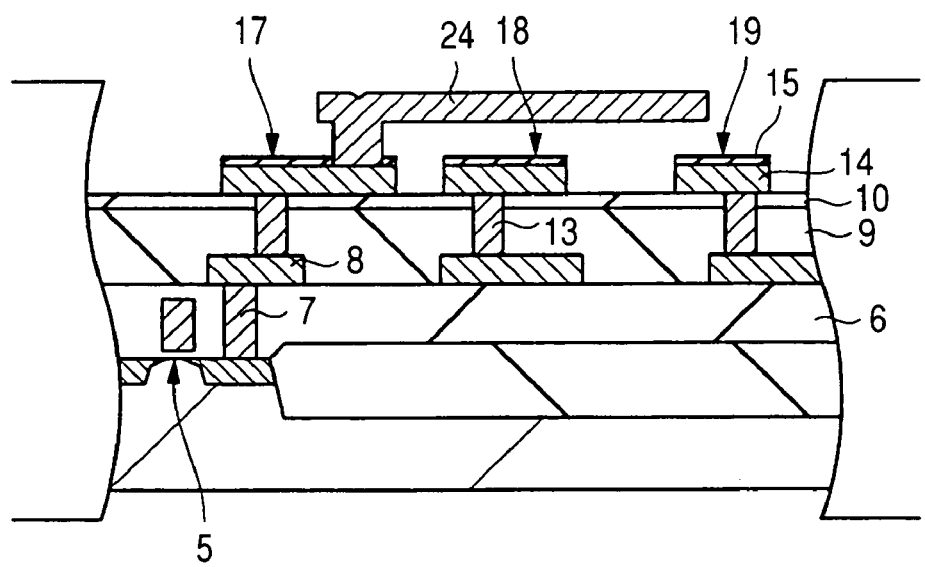
FIG. 15 is a cross-sectional drawing illustrating a manufacturing process of a MEMS switch following FIG. 14.

The sacrificial layer 20 is removed by wet-etching and dried, resulting in a MEMS shown in FIG. 15 being completed on the semiconductor wafer on which the MISFET 5 was formed. In the first embodiment, a hydrofluoric acid water solution was used for removing the sacrificial layer 20. Since pure water cleaning is carried out after wet etching, the cantilever beam 24 sticks to the pull-in electrode 18 and the fixed contact 19 formed of the metal layer 14 due to the surface tension of water, if it is dried as is. Therefore, it should be washed by using ethanol after washing in clear water, and finally, supercritical drying is carried out by using carbon dioxide. Thus, a MEMS switch in the first embodiment can be formed on a semiconductor wafer.

Afterwards, treatments described as follows will be applied to the MEMS switch formed on the semiconductor wafer. Specifically, the insulator 15 deposited on the contact surface of the fixed contact 19 is modified once. First, the cantilever beam 24 is moved so as to contact the fixed contact 19 by applying a potential difference between the pull-in electrode 18 and the cantilever beam 24. Next, dielectric breakdown occurs by applying a voltage corresponding to the electric field strength, which exceeds the breakdown field strength of the insulator 15, to the insulator 15. The voltage at this time is determined according to the configuration and the thickness of the deposited insulator 15. By modification of the insulator 15 once as mentioned herein, the contact point part where the switch repeatedly makes contact can be mechanically protected, and the contact point can be achieved in which electrical signals are transmitted through the current path formed by dielectric breakdown.

According to the first embodiment, the switch is not turned on by contacting the metal to each other, but the modified insulator 15 is formed on the contact surface of the cantilever beam 24 and the fixed contact 19 which constitute the switch. Thus, the mechanical strength of the contact point part of the switch can be improved. In other words, since the insulator 15 was sintered by the heat-treatment, the mechanical strength of the insulator 15 is improved. Therefore, the mechanical strength of the contact point part can be improved by using the insulator 15, to which a heat-treatment is applied, for the contact point part of the switch.

Figure 16:
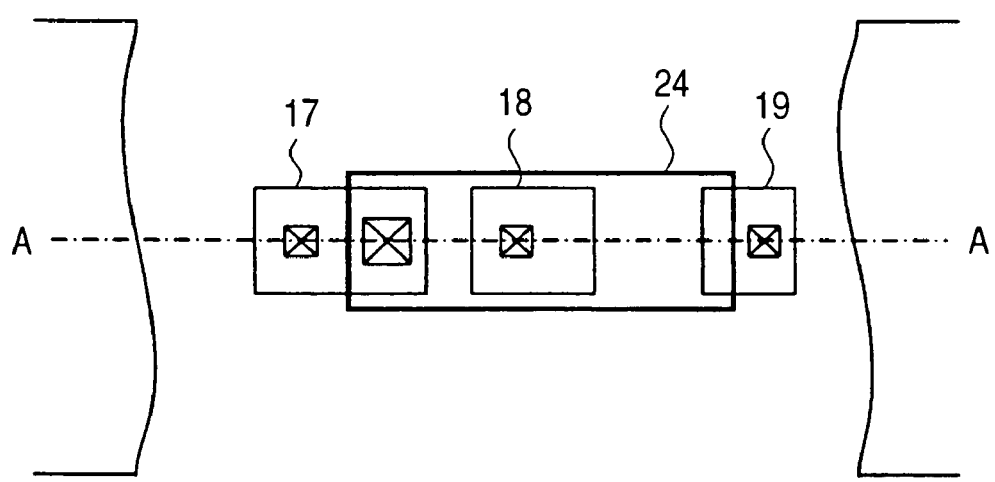
FIG. 16 is a plane drawing illustrating a plane arrangement of a MEMS switch in the first embodiment.
Figure 17:
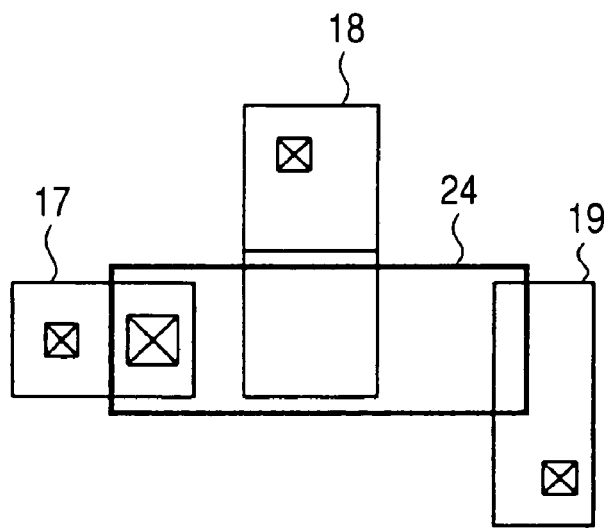
FIG. 17 is a plane drawing illustrating another plane arrangement of a MEMS switch.

FIG. 16 is a drawing of a MEMS switch formed on the MISFET 5 as shown in FIG. 15 as seen from the top. That is, the cross-sectional drawing cut at the line A-A in FIG. 16 corresponds to FIG. 15. The important point for the structure of a SMES switch is that the cantilever beam 24 is located at a position opposite the pull-in electrode 18, and it determines the direction in which the cantilever beam 24 moves. Therefore, as shown in FIG. 17, the arrangement of the draw-out plug of the fixed contact 19 and the pull-in electrode 18 may leave from the center part (right under the cantilever beam 24) of the MEMS switch.

Moreover, the insulator 15 protecting the pull-in electrode 18 (refer to FIG. 15) can form a covering layer consisting of the insulator 15 which has a different thickness than the pull-in electrode 18 and the fixed contact 19 by preparing a different mask from the pull-in electrode and by controlling the number of depositions of the insulator 15. If the thickness of the insulator 15 on the pull-in electrode 18 is made thicker, it is more difficult for the current path to be created except for the fixed contact 19, so that highly reliable terminals can be obtained while the first modification of the insulator 15 is carried out and the MEMS switch is utilized.

Figure 18:
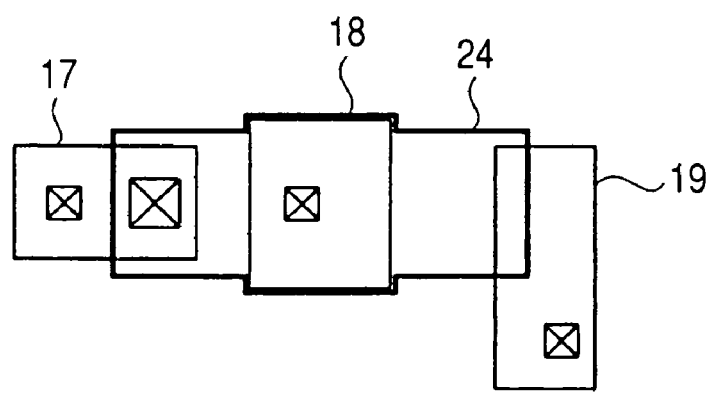
FIG. 18 is a plane drawing illustrating another plane arrangement of a MEMS switch.

Moreover, as shown in FIG. 18, the size of the pull-in electrode 18 may be changed. If the area where the pull-in electrode 18 faces the cantilever beam 14 becomes larger, the voltage for turning on the MEMS switch can be made smaller. That is, even if the voltage applied to the gap of the pull-in electrode 18 and the cantilever beam 24 is made small, the cantilever beam 24 can be moved.

Figure 19:
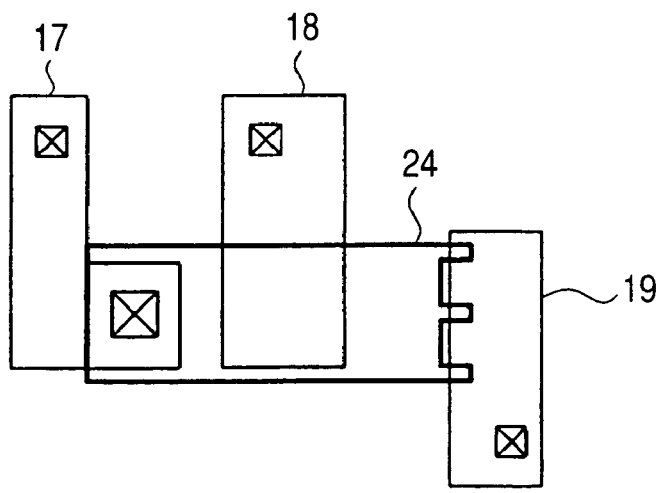
FIG. 19 is a plane drawing illustrating another plane arrangement of a MEMS switch.

Moreover, as shown in FIG. 19, the tip of the cantilever beam 24 can be made so as to have a plurality of protruding shapes. As a result, since a plurality of current paths from the cantilever beam 24 to the fixed contact 19 can be secured, the tolerance to a large current can be improved in the MEMS switch.

Moreover, in the first embodiment, the contact point of a MEMS switch is protected by using an insulator having a compatibility with a conventional CMOS process and the current path is secured as well by this insulator which is modified by one-time dielectric breakdown. Therefore, a transistor can be formed by using a CMOS process, and a MEMS switch with high reliability can be formed. In other words, a MEMS switch in the first embodiment can be easily formed by using a CMOS process.

Next, a modification of the first embodiment will be described.

FIGS. 20 to 25 are explanations of a manufacturing method in which a MEMS switch described in the first embodiment is embedded between the first signal line and the second signal line. The manufacturing method will be described only for the parts that are different from the first embodiment.

Figure 20:
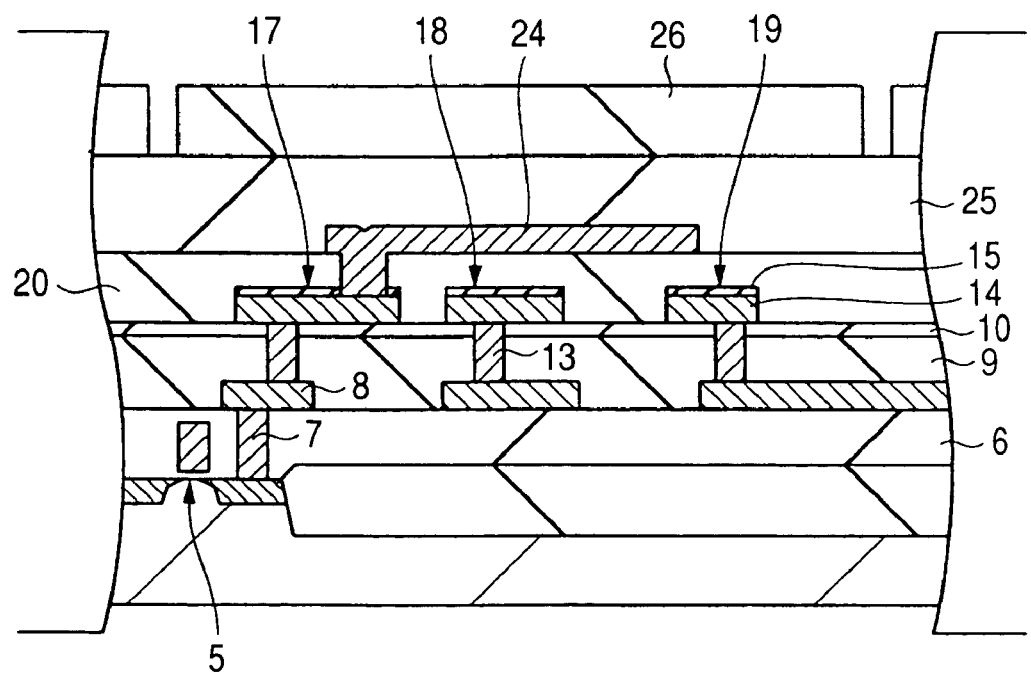
FIG. 20 is a cross-sectional drawing illustrating a manufacturing process of a MEMS switch in a modification of the first embodiment.

After a basic structure of a MEMS switch is formed as explained in the first embodiment, as shown in FIG. 20, a plasma TEOS film is deposited again as a additional sacrificial layer (second sacrificial layer) 25 on the top of the cantilever beam 24 of the MEMS switch and the sacrificial layer 20 corresponding to the gap layer of the MEMS switch. Then, after a photo resist 26 is coated on the sacrificial layer 25, the photo resist 26 is patterned by using a photolithography technique. Patterning is carried out so that the photo resist 26 does not remain on the region where the frame body is formed.

Figure 21:
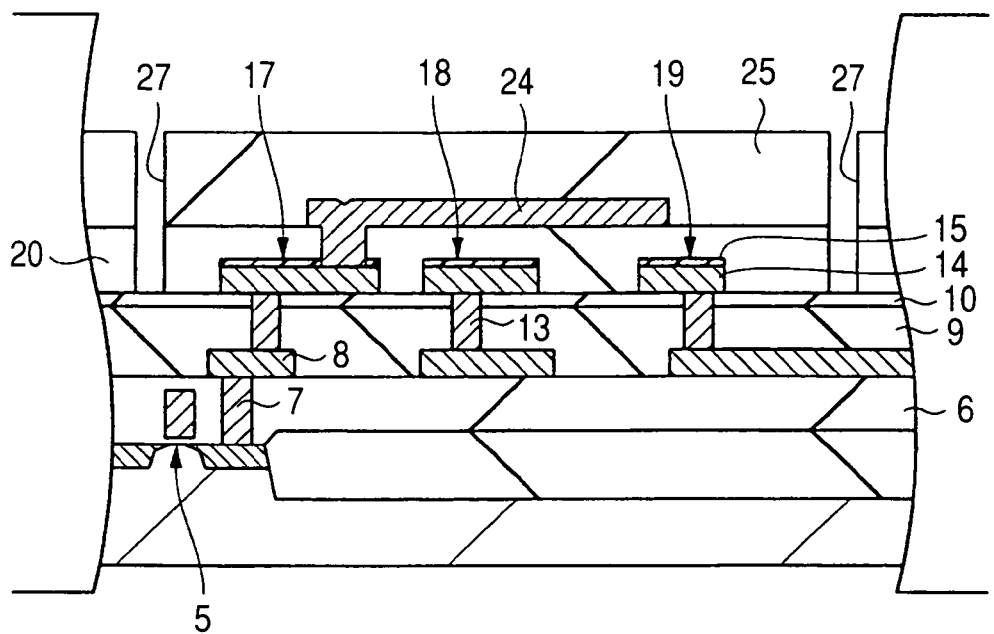
FIG. 21 is a cross-sectional drawing illustrating a manufacturing process of a MEMS switch following FIG. 20.

As shown in FIG. 21, by dry-etching using the patterned photo resist 26 as a mask, the sacrificial layer 20 and the sacrificial layer 25 are processed up to the covering layer 10 formed underneath the beam support 17, the pull-in electrode 18, and the fixed contact 19 of the MEMS switch. The through holes 27 formed in the sacrificial layer 20 and the sacrificial layer 25 are parts to be columns for the frame body for covering the MEMS switch. These through holes 27 are formed to surround the beam support 17, the pull-in electrode 18, the fixed contact 19, and the cantilever beam 24.

Figure 22:
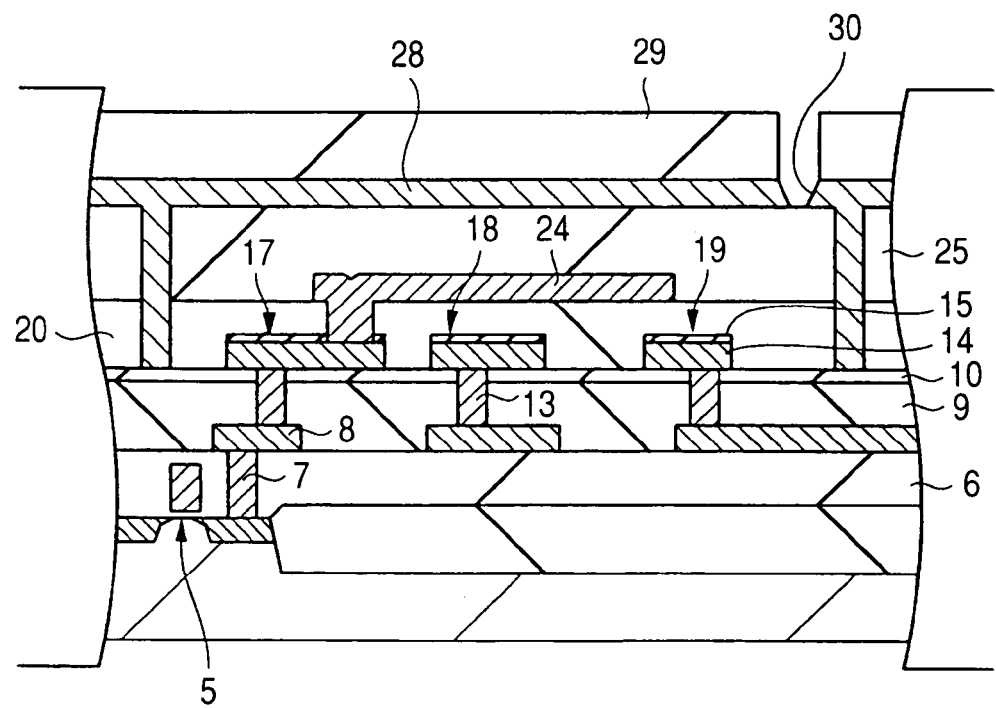
FIG. 22 is a cross-sectional drawing illustrating a manufacturing process of a MEMS switch following FIG. 21.
Figure 23:
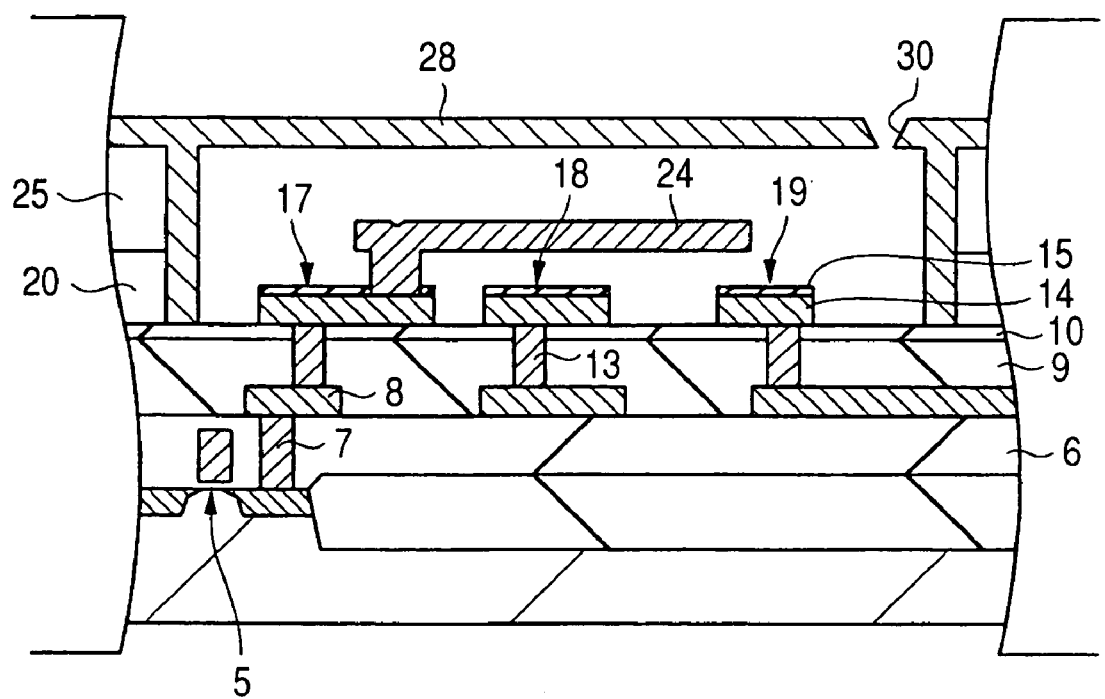
FIG. 23 is a cross-sectional drawing illustrating a manufacturing process of a MEMS switch following FIG. 22.

Next, as shown in FIG. 22, the metal layer 28 is formed on the sacrificial layer 25 including the inside of the through holes 27. This metal layer 28 consists of the frame body surrounding the beam support 17, the pull-in electrode 18, the fixed contact 19, and the cantilever beam 24. Then, after a photo resist 29 is coated on the metal layer 28, the photo resist 29 is patterned by using a photolithography technique. Patterning is carried out so that the photo resist 29 does not remain on the region where the hole 30 is formed in the metal layer 28. The hole 30 is formed in the metal layer 28 by etching using the patterned photo resist 29 as a mask. This hole 30 is provided to send a chemical to the sacrificial layer 20 and the sacrificial layer 25 while wet-etching the sacrificial layer 20 and the sacrificial layer 25. If the size of the hole 30 is too large, etching of the sacrificial layer 20 and the sacrificial layer 25 proceeds easily. However, since filling the hole in subsequent processes becomes difficult, it should be fabricated to the extent of being a size which does not make it difficult to fill in the hole. Moreover, although only one hole 30 is drawn in FIG. 22, a plurality of holes 30 is formed in cross-sections which are not shown in FIG. 22 during a practical manufacturing process. In the modification, a tungsten film is used for the metal layer 28.

Afterwards, the sacrificial layer 20 and the sacrificial layer 25 in the region surrounded by the frame body consisting of the metal layer are removed by injecting a chemical from the hole 30 (wet-etching) and dried, resulting in a MEMS switch surrounded by a frame body being completed. In this modification, hydrofluoric acid water solution was used for removing the sacrificial layer 20 and the sacrificial layer 25. Pure water cleaning is carried out after wet etching. Therefore, if it is dried as is after the pure water cleaning, due to the surface tension of water the cantilever beam 24 sticks to the pull-in electrode 18 and the fixed contact 19, or the insulator 15 which is a covering layer, therefore it should be washed by using ethanol after washing in clear water, and finally, supercritical drying is carried out by using carbon dioxide.

Figure 24:
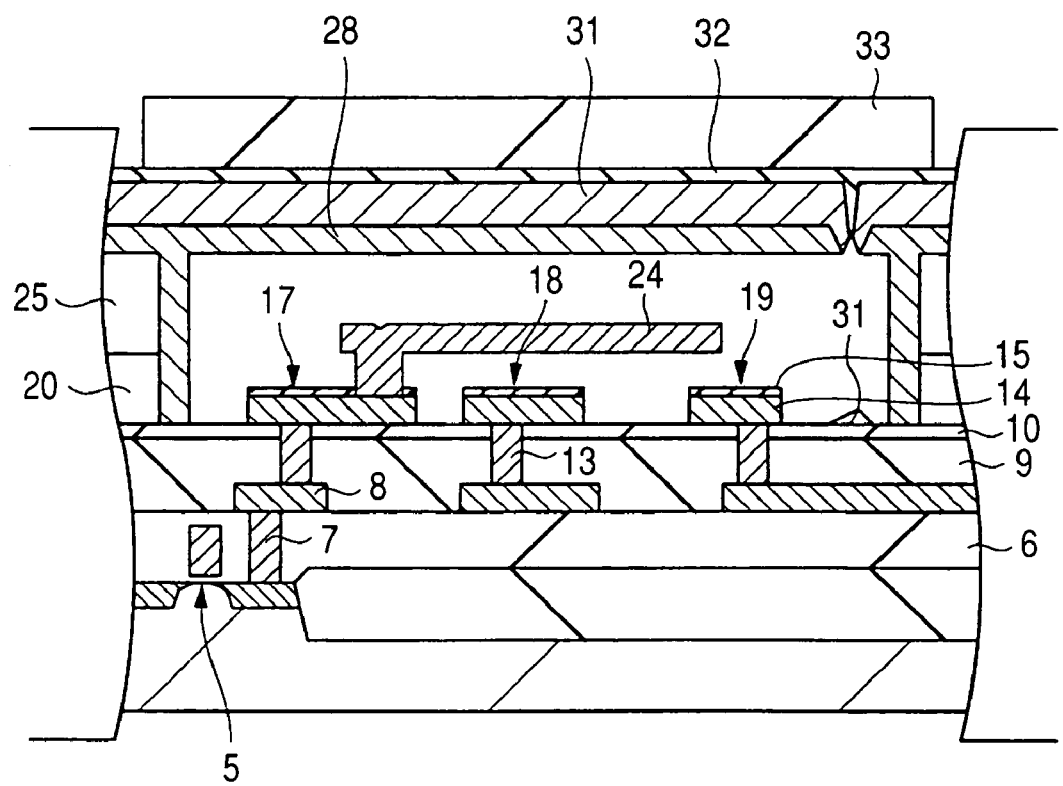
FIG. 24 is a cross-sectional drawing illustrating a manufacturing process of a MEMS switch following FIG. 23.
Figure 25:
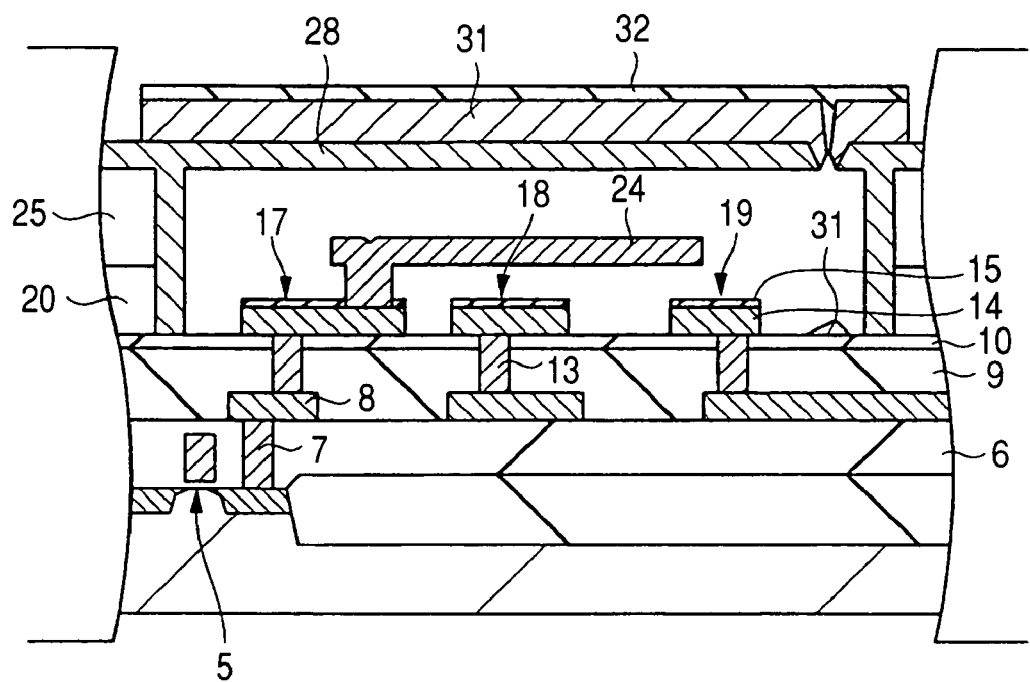
FIG. 25 is a cross-sectional drawing illustrating a manufacturing process of a MEMS switch following FIG. 24.

Next, in order to fill up the hole 30 utilized for wet-etching as shown in FIG. 24, a metal layer 31 is deposited on the metal layer 28 by using, for instance, a sputtering technique. Moreover, an insulator 32 covering the metal layer 31 is deposited by using, for instance, a CVD technique. Thus, by covering the hole 30 by using two kinds of deposition techniques, filling which has less wraparound on the underside of the metal layer 28 can be achieved. Since the metal layer 31 is deposited by using a sputtering technique, there is a possibility that the metal layer 31 is deposited inside of the cavity region formed by the wet-etching. However, if the hole 30 for the wet-etching is arranged at the place which is far from the cantilever beam part of the MEMS switch, there are no obstacles to the operation of the MEMS switch. In this modification, a tungsten film and a silicon nitride film are used for the metal layer 31 and the insulator 32, respectively. After filling the hole 30, a pattern for processing the metal layer 31 and the insulator 32 is transferred to the photo resist 33 by using a photolithography technique. The metal layer 31 and the insulator 32 are processed by dry-etching using the patterned photo resist 33 as a mask, resulting in a MEMS switch which is sealed by the signal line layer being obtained as shown in FIG. 25. Specifically, a MEMS switch can be fabricated between the signal line layers by configuring the MEMS switch so as to be surrounded by a frame body.

Figure 26:
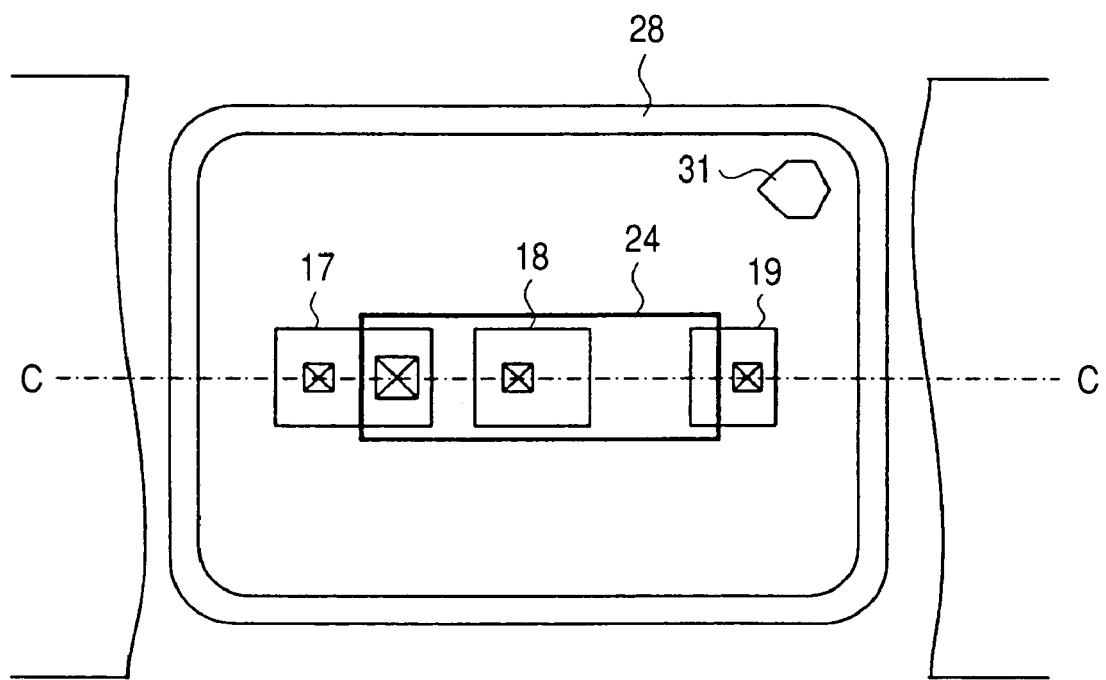
FIG. 26 is a plane drawing illustrating a plane arrangement of a MEMS switch in a modification of the first embodiment.

FIG. 26 is a drawing as seen from the top illustrating a MEMS switch, shown in FIG. 25, which is sealed by a signal line layer. In other words, the cross-section C-C in FIG. 26 corresponds to FIG. 25. As shown in FIG. 25, since the metal layer 31 which fills the hole 30 for wet-etching is deposited by using a sputtering technique, there is a possibility that the material (metal layer 31) is deposited inside of the cavity region through the hole 30. However, if the hole 30 for wet-etching is arranged at the place which is far from the cantilever beam part 24 and the fixed contact 19 of the MEMS switch, there is no obstacle to the operation of the MEMS switch. It is not necessary for the position of the hole 30 to be arranged on the line C-C, as shown in FIG. 26; it may be arranged at a position closer to the wall of the frame body consisting of the metal layer 28 if it is arranged in a range where the sacrificial layer 20 and the sacrificial layer 25 can be removed by a wet-etching process.

Afterwards, treatments described as follows are applied to the MEMS switch formed on the semiconductor wafer. Specifically, as shown in FIG. 25, the insulator 15 deposited on the contact surface of the fixed contact 19 is modified once. First, the cantilever beam 24 is moved so as to contact the fixed contact 19 by applying a potential difference between the pull-in electrode 18 and the cantilever beam 24. Next, a voltage corresponding to the electric field strength, which exceeds the breakdown field strength of the insulator 15, is applied to the insulator 15, resulting in dielectric breakdown occurring. The voltage at this time is determined according to the configuration and the thickness of the deposited insulator 15. By modification of the insulator 15 once as mentioned herein, the contact point part where the switch repeatedly makes contact can be mechanically protected, and a contact point can be achieved in which electrical signals are transmitted through the current path formed by dielectric breakdown.

Next, another modification of the first embodiment will be described.

FIGS. 27 to 36 are explanations of a manufacturing method in which a MEMS switch described in the first embodiment is formed on the topmost layer of a semiconductor wafer and it is sealed by a material such as a glass, etc. except for a deposited silicon film. The manufacturing method will be described only for those parts which are different from the first embodiment.

Figure 27:
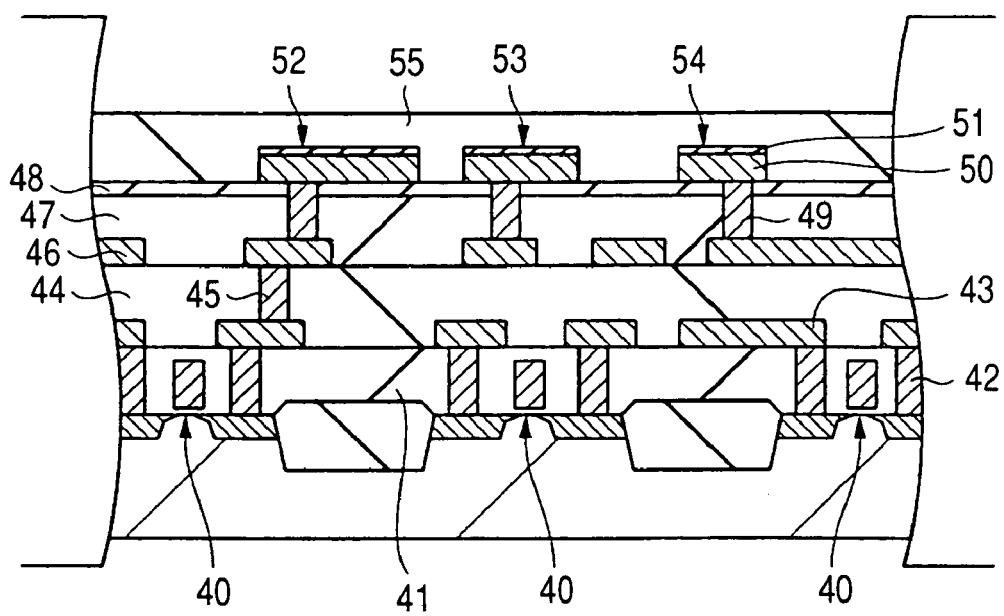
FIG. 27 is a cross-sectional drawing illustrating a manufacturing method of a SMES switch in another modification of the first embodiment.

As shown in FIG. 27, an interlayer dielectric 41 is formed on a MISFET 40 formed on the surface of a semiconductor wafer composed of silicon, and a plug 42 is formed in the interlayer dielectric 41. Next, a first level interconnect 43 is formed on the interlayer dielectric 41. Similarly, an interlayer dielectric 44 is formed on the first level interconnect 43 and a plug 45 is formed in this interlayer dielectric 44. Then, after forming a second level interconnect 46 on the interlayer dielectric 44, an interlayer dielectric 47 and a covering layer 48 are formed on the second level interconnect 46. After a plug 49 is formed in the interlayer dielectric 47 and the covering layer 48, a metal layer 50 and an insulator 51 are laminated, in order, on the covering layer 48. The metal layer 50 is formed of, for instance, a polysilicon film, and the insulator 51 is formed of, for instance, an aluminum oxide film.

Next, the metal layer 50 and the insulator 51 are patterned by using a photolithography technique and an etching technique, resulting in a beam support 52, a pull-in electrode 53, and a fixed contact 54 of the MEMS switch being formed. Then, a sacrificial layer 55 is formed to cover the beam support 52, the pull-in electrode 53, and the fixed contact 54.

Figure 28:
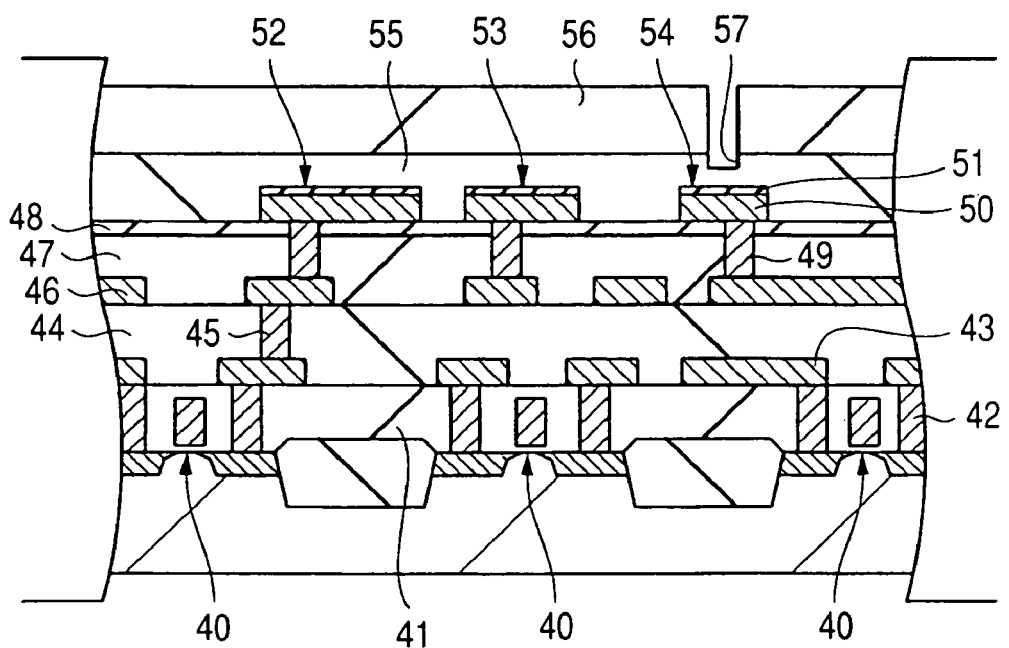
FIG. 28 is a cross-sectional drawing illustrating a manufacturing process of a MEMS switch following FIG. 27.

After a photo resist 56 is coated on the sacrificial layer 55 as shown in FIG. 28, the photo resist 56 is patterned by using a photolithography technique. Patterning is carried out so that the photo resist 56 does not remain in the region where a dimple 57 is formed. Then, the dimple 57 is formed in the sacrificial layer 55 by using the photo resist 56 as a mask. This dimple 57 is formed in the upper part of the fixed contact 54 and formed so as not to reach the fixed contact 54.

Figure 29:
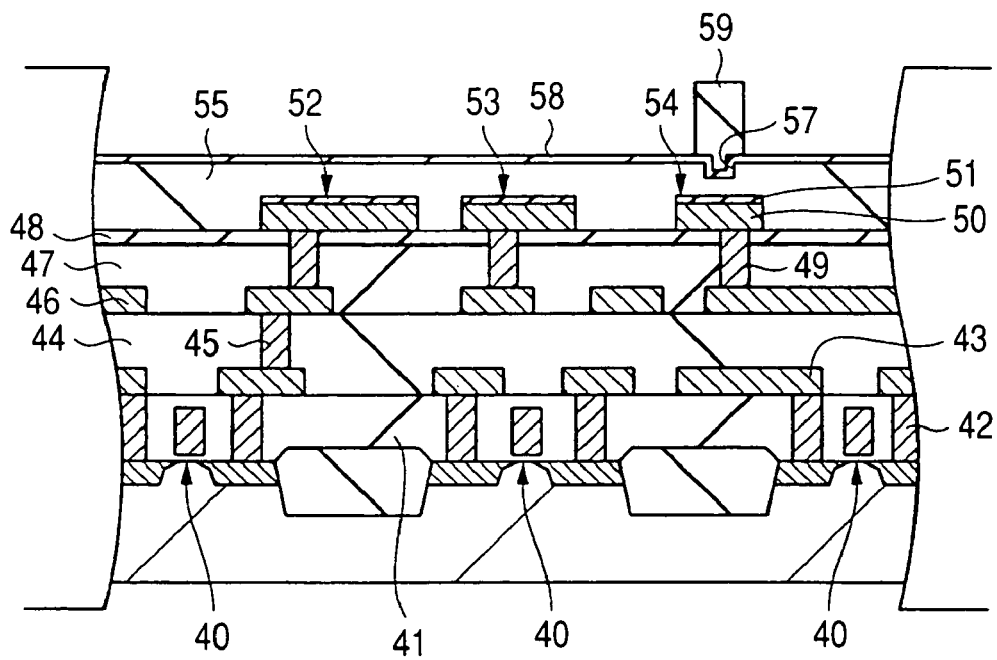
FIG. 29 is a cross-sectional drawing illustrating a manufacturing process of a MEMS switch following FIG. 28.

Next, as shown in FIG. 29, after an insulator (second insulator) 58 is formed on the sacrificial layer 55 including the dimple 57, a photo resist 59 is coated on the insulator 58. Then, the photo resist 59 is patterned by using a photolithography technique. Patterning is carried out so that the photo resist 59 remains only in the dimple 57 and the surroundings thereof. Afterwards, the insulator 58 is left only in the dimple 57 and the surroundings thereof by etching the insulator 58 using the patterned photo resist 59 as a mask. Herein, the insulator 58 is composed of, for instance, an aluminum oxide film.

Figure 30:
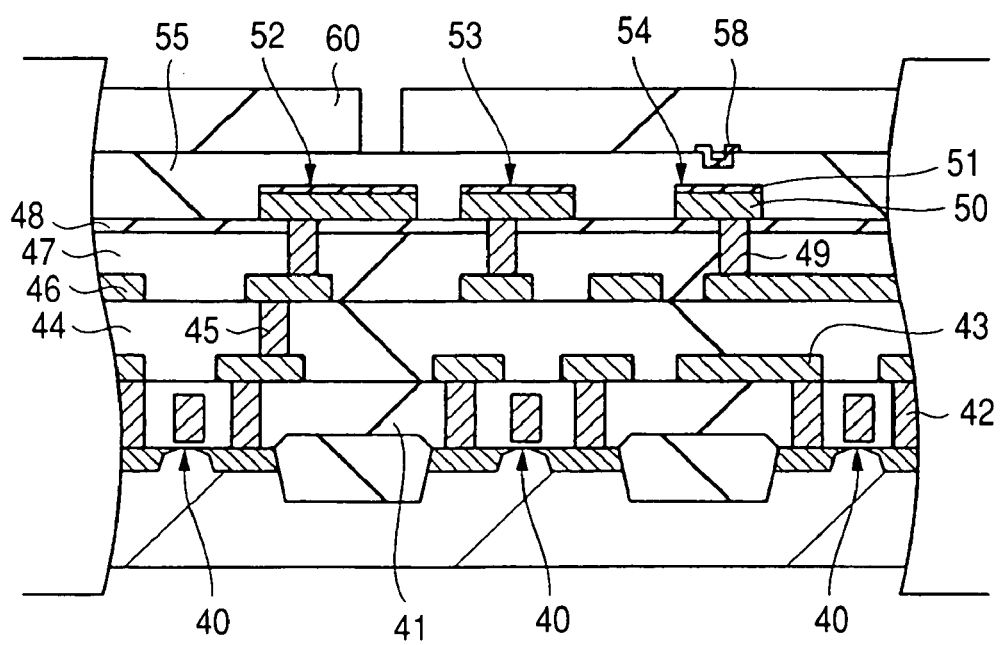
FIG. 30 is a cross-sectional drawing illustrating a manufacturing process of a MEMS switch following FIG. 29.

As shown in FIG. 30, a photo resist 60 is coated on the sacrificial layer 55 including the dimple 57 in which the insulator 58 was left remaining. Then, by using a photolithography technique, the photo resist 60 is patterned. Patterning is carried out so that the photo resist 60 should not remain in the formation region of the opening which reaches the beam support 52.

Figure 31:
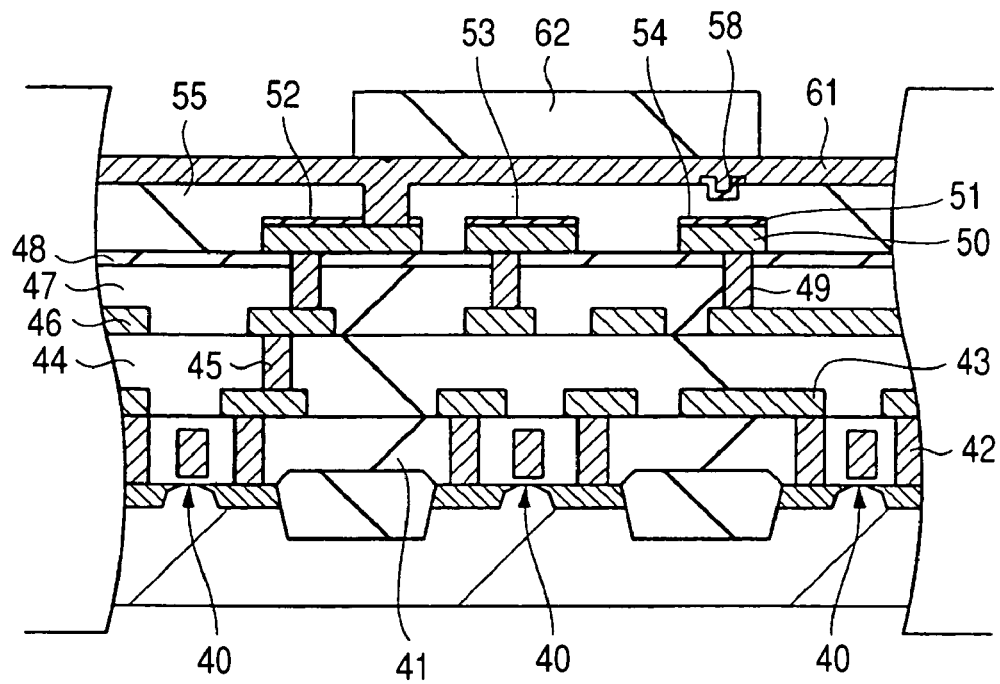
FIG. 31 is a cross-sectional drawing illustrating a manufacturing process of a MEMS switch following FIG. 30.

Next, as shown in FIG. 31, an opening which reaches the beam support 52 is formed by etching the sacrificial layer 55 using the patterned photo resist 60 as a mask. A metal layer 61 is formed on the sacrificial layer 55 which includes the opening and on the dimple 57 where the insulator 58 is left remaining. Afterwards, a photo resist 62 patterned on the metal layer 61 is formed by using a photolithography technique. Patterning is carried out so that the photo resist 62 remains in the region where the cantilever beam is formed.

Figure 32:
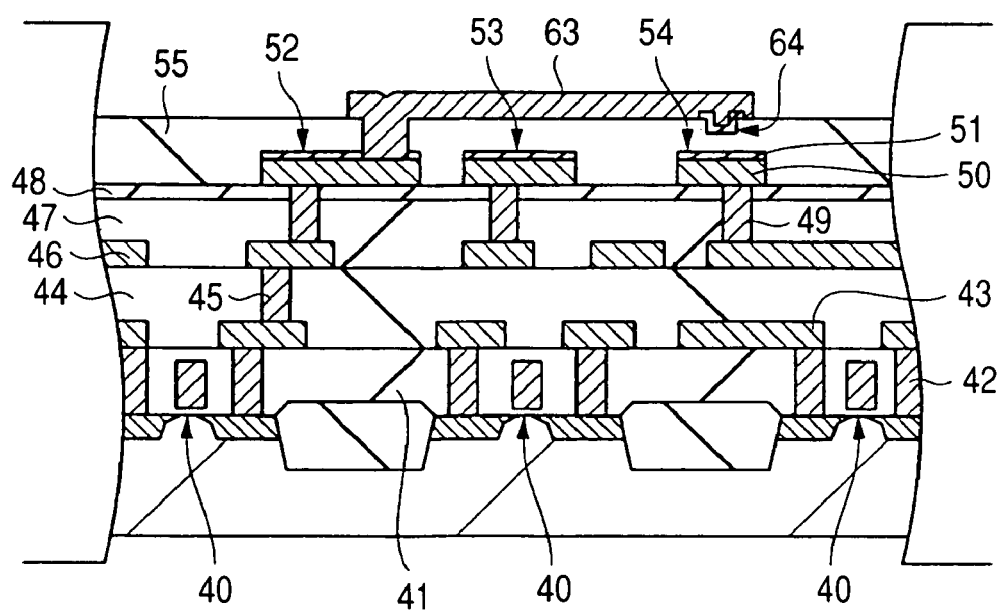
FIG. 32 is a cross-sectional drawing illustrating a manufacturing process of a MEMS switch following FIG. 31.

Next, as shown in FIG. 32, a cantilever beam 63 is formed by etching the metal layer 61 using the patterned photo resist 62 as a mask. In this modification, a protrusion-shaped contact 64 is formed at the edge of the cantilever beam 63. In other words, the contact 64 is formed by embedding the insulator 58 and the metal layer 61 in the dimple 57 formed in the sacrificial layer 55. Specifically, in this modification, in order to suppress the contact resistance of the contact point between the cantilever beam 63 and the fixed contact 54, a structure in which the fixed contact 54 easily contacts the contact 64 is created by making a structure where the contact 64 located at the edge of the cantilever beam 63 is placed overhanging from the cantilever beam 63. As a result, the reliability of the MEMS switch while making contact can be improved.

Figure 33:
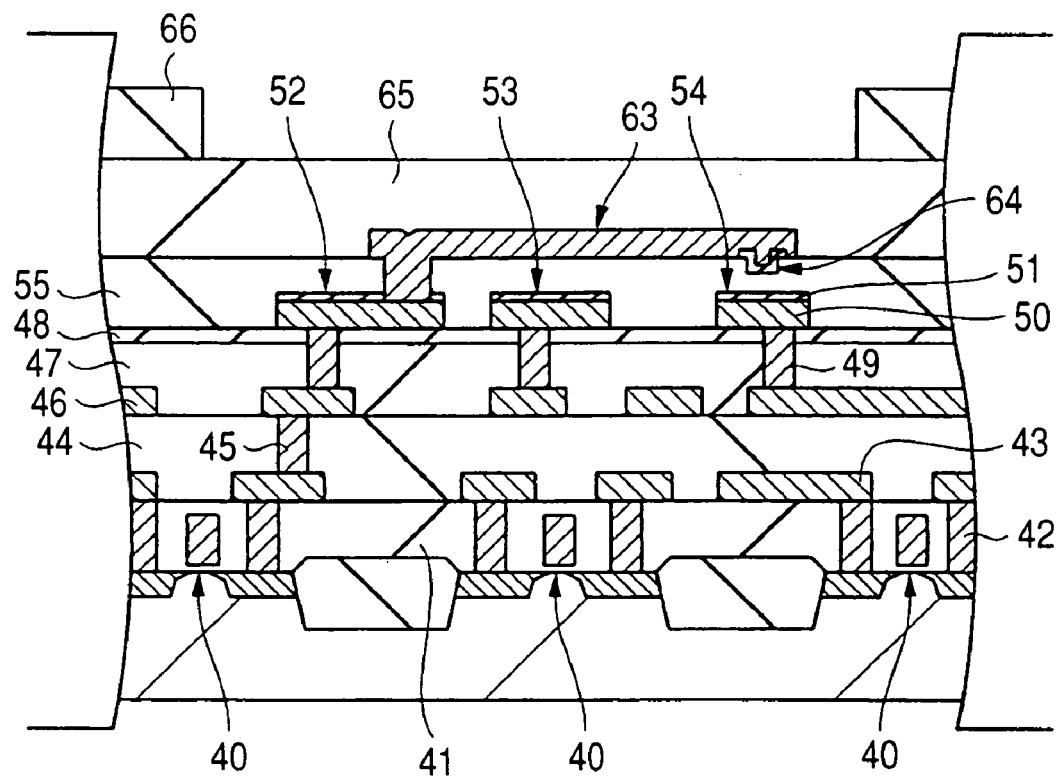
FIG. 33 is a cross-sectional drawing illustrating a manufacturing process of a MEMS switch following FIG. 32.

As shown in FIG. 33, as an additional sacrificial layer 65, a TEOS film is deposited again on the top of the sacrificial layer 55 to be a gap of the MEMS switch and on the cantilever beam 63 of the MEMS switch. Then, a mask 66 is formed of a material which has a selection ratio between the sacrificial layer 55 and the sacrificial layer 65 in order to remove the sacrificial layer 55 and the sacrificial layer 65 in the region (cavity region) where a gap of the MEMS switch is formed by etching.

Figure 34:
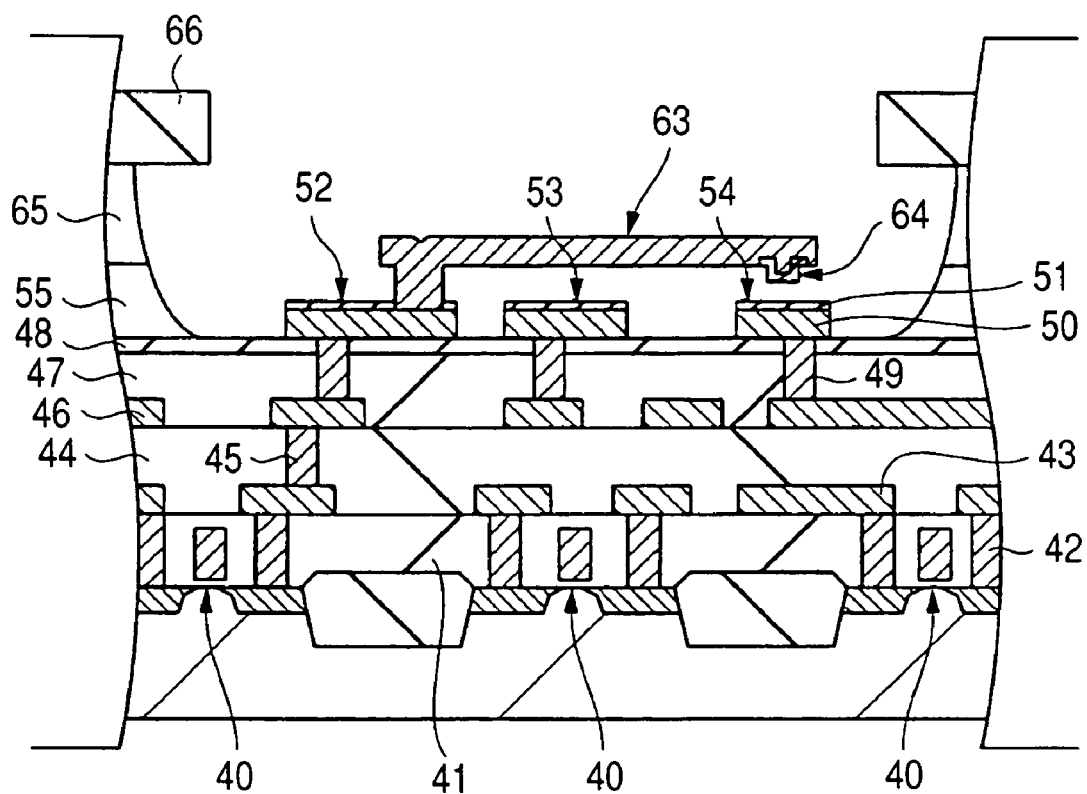
FIG. 34 is a cross-sectional drawing illustrating a manufacturing process of a MEMS switch following FIG. 33.

Afterwards, as shown in FIG. 34, the sacrificial layer 55 and the sacrificial layer 65 are removed by etching using the mask 66, resulting in the cavity region of the MEMS switch being formed.

Figure 35:
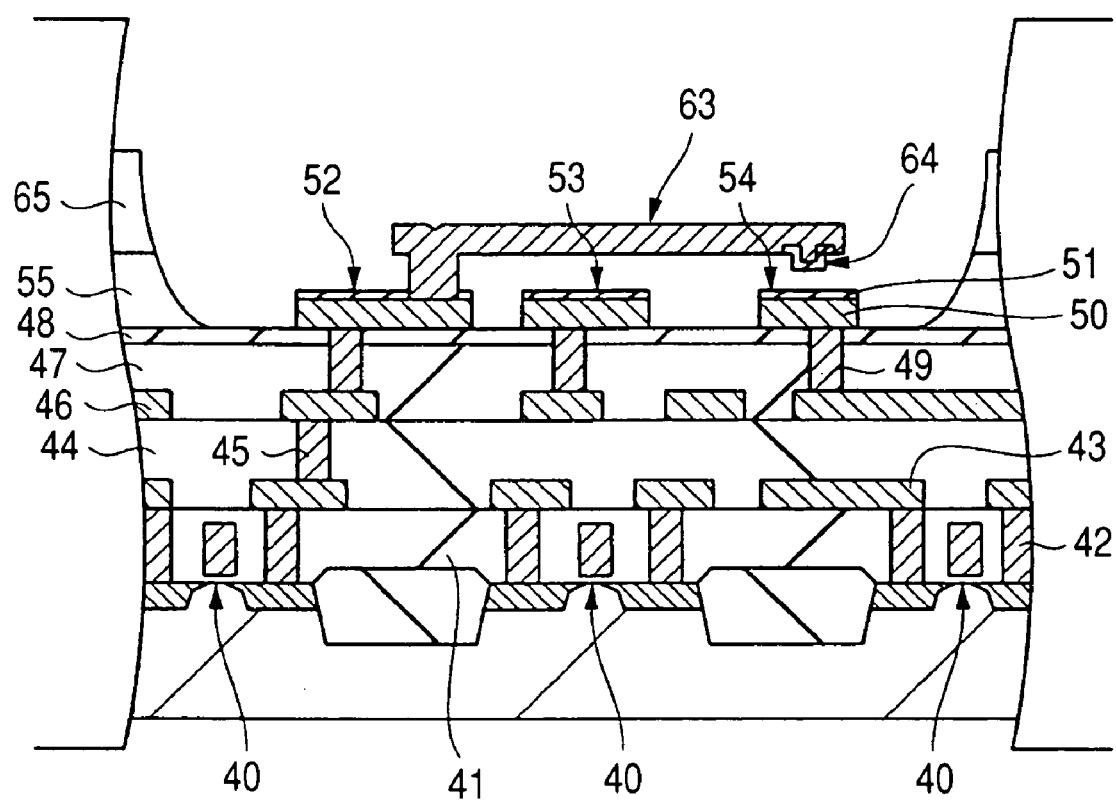
FIG. 35 is a cross-sectional drawing illustrating a manufacturing process of a MEMS switch following FIG. 34.
Figure 36:
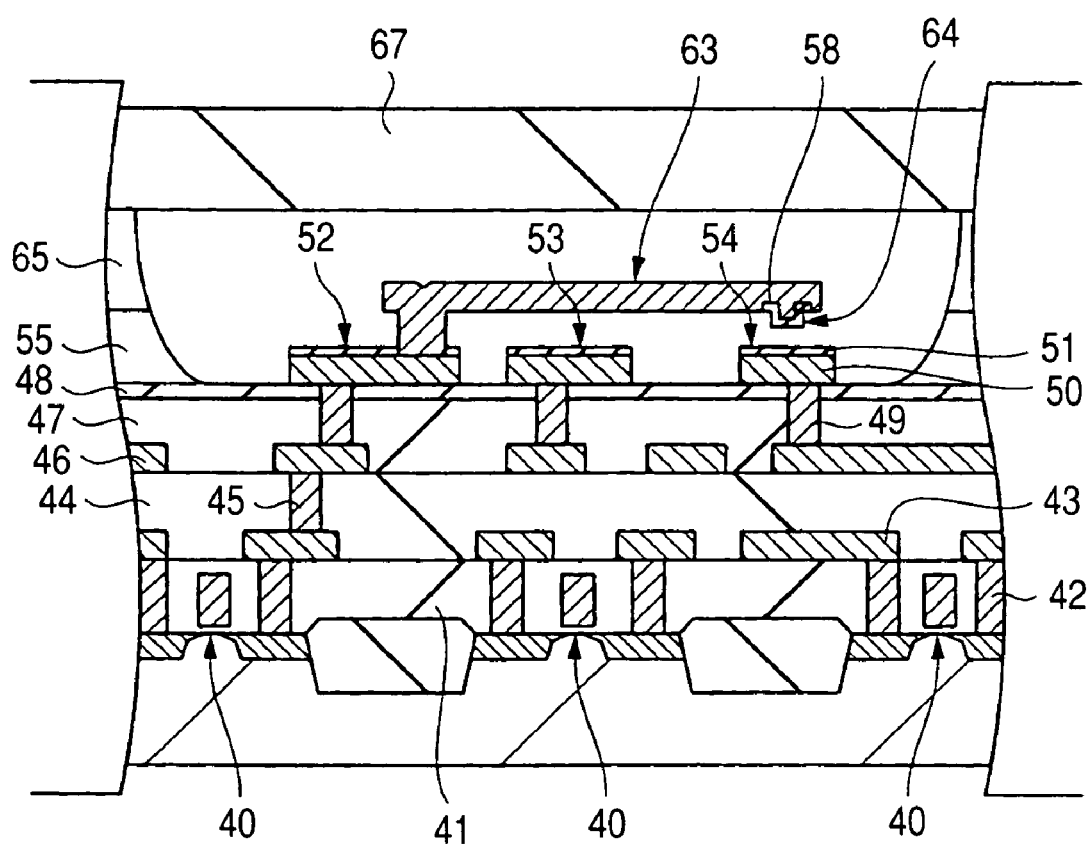
FIG. 36 is a cross-sectional drawing illustrating a manufacturing process of a MEMS switch following FIG. 35.

Next, as shown in FIG. 35, the mask 66 is removed and the surface of the sacrificial layer 65 consisting of a silicon oxide system film is washed. As shown in FIG. 36, a Pyrex (registered trademark) glass wafer 67 and the semiconductor wafer on which the MEMS switch is formed are stacked together to make a positive contact. Although it is not described in FIG. 36, the conductive components of the MEMS switch such as the pull-in electrode 53, the fixed contact 54, and the cantilever beam 63 are arranged in a region which is not influenced by the junction field in order to prevent the MEMS switch from being destroyed by the junction field when the anode is connected. Thus, a condition for sealing the MEMS switch at the topmost layer of the semiconductor wafer can be obtained.

Afterwards, the following treatment is applied to the MEMS switch formed in the semiconductor wafer. Specifically, as shown in FIG. 36, the insulator 51 of the fixed contact 54 and the insulator 58 of the contact 64 are modified once. First of all, the contact 64 of the cantilever beam 63 is moved so as to contact the fixed contact 54 by applying a potential difference between the pull-in electrode 53 and the cantilever beam 63. Next, a voltage corresponding to the electric field strength exceeding the breakdown field strength is applied to the film, which is a sum of the insulator 51 and the insulator 58, resulting in dielectric breakdown occurring. The voltage at this time is determined according to the configuration and the thickness of the deposited insulator 51 and the insulator 58. By modification of the insulator 51 and the insulator 58 once as mentioned herein, the contact point part where the switch repeatedly makes contact can be mechanically protected and a contact point can be achieved in which electrical signals are transmitted through the current path formed by dielectric breakdown.

In this modified embodiment, the insulator 51 is formed on the fixed contact 54 and the insulator 58 is formed on the contact 64 (a part of the cantilever beam 63). However, the insulator may not be formed on both, but it may be formed on either of the two.

Figure 37:
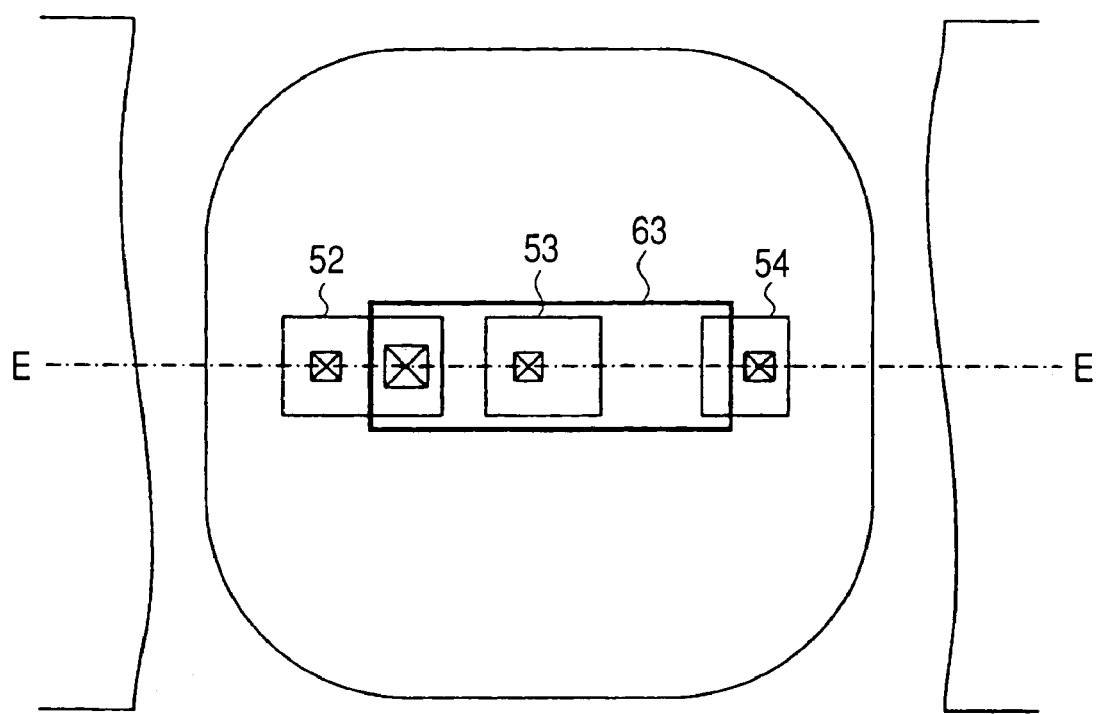
FIG. 37 is a plane drawing illustrating a plane arrangement of a MEMS switch in another modification of the first embodiment.

FIG. 37 is a drawing as seen from the top illustrating the state in which a MEMS switch formed on the topmost layer of a semiconductor wafer is sealed by a material, such as glass etc., except for a deposited silicon film. In other words, the cross-section E-E in FIG. 37 corresponds to FIG. 36. The important point for the structure of a SMES switch is that the cantilever beam 63 is located at a position facing the pull-in electrode 53 and it determines the direction in which the cantilever beam 63 moves. And, it is a point where a modified insulator is formed on the contact surface of the cantilever beam 63 and the fixed contact 54. As a result, the contact point part can be mechanically protected and a contact point can be achieved in which electrical signals are transmitted through the current path formed by dielectric breakdown.

Second Embodiment

Figure 38:
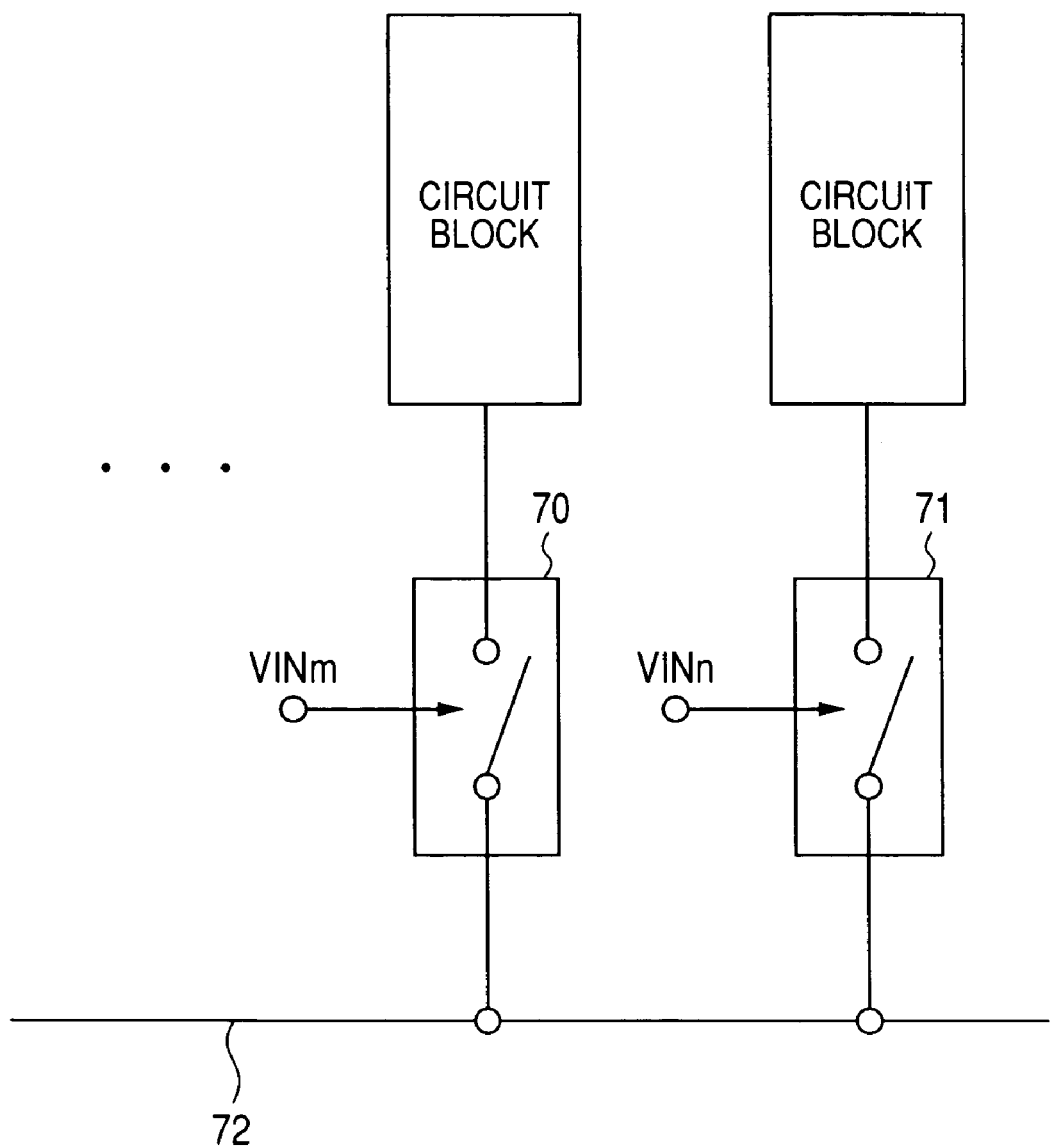
FIG. 38 is a drawing illustrating an example in which a MEMS switch is used for a feeding switch of a circuit block in the second embodiment.

FIG. 38 is an example in which a MEMS switch explained in the aforementioned first embodiment is used as a feeding switch for a circuit block. In FIG. 38, the mth circuit block and the nth circuit block are shown among a plurality of circuit blocks.

When the power supply of the circuit block m is ON, VINm is applied to the MEMS switch 70 to turn on the mth MEMS switch 70. The voltage of the feed line 72 is supplied to the circuit block m through the current path of this MEMS switch 70.

When the power supply of the circuit block n is ON, VINn is applied to the MEMS switch 71 to turn on the nth MEMS switch 71. The voltage of the feed line 72 is supplied to the circuit block n through the current path of this MEMS switch 71.

When VINm and VINn are simultaneously applied and the mth MEMS switch 70 and the nth MEMS switch 71 are simultaneously turned on, the circuit block m and the circuit block n can be fed at the same time. Moreover, energy-savings of the entire integrated circuit can be achieved by cutting off feed power by turning off the MEMS switch and stopping at every circuit block when unused.

Conventionally, a transistor has been used for the feeding switch of a circuit block. In the case when a transistor is used for the feeding switch, the man-hours for the design and the verification increase when the layout becomes complex. Therefore, the man-hours have been reduced by providing feed switches in the circumference of the circuit block and by separating the design of the circuit block itself from the design of the power supply of the circuit block.

However, the MEMS switch explained in the aforementioned first embodiment can be formed in the signal line layer, so that a switch can be made in the upper signal line layer. Therefore, it circumvents the need to change the design of the circuit block itself and makes it possible to reduce the area occupied by the feed switch.

A MEMS switch has features where the on resistance is lower and the current carrying capacity for transmission is larger than a switch using a transistor (CMOS switch). A lower contact resistance between contacts is desired for a MEMS switch which transports larger current carrying capacity as a current path, so that one with high reliability is desired for a contact terminal composed of a metallic material. As explained in the aforementioned first embodiment, a structure in which a contact terminal is covered with a protection film consisting of a modified insulator has both low contact resistance and mechanical stability, and it is a desirable structure to obtain a MEMS switch with high reliability. In the case when it is used for a feed switch of a circuit block, there is an advantage that it is not necessary to change the design because the transport current carrying capacity of the MEMS switch is large enough even if there is a change at the stage of the design in the amount of the current transported to the circuit block receiving the feed power. Therefore, the load on the designer is reduced and the development period can be shortened.

As mentioned above, the present invention which had been performed by the inventors was concretely described on the basis of the embodiments. However, the present invention is not intended to be limited to the aforementioned embodiments, and it is needless to say that it is possible to make changes in a variety of ways within the range in which it does not deviate from the scope.

The present invention can be widely utilized by manufacturers which produce semiconductor devices including a MEMS switch.

What is claimed is:

1. A semiconductor device including a switch and a MISFET, the switch comprising a cantilever beam and a fixed contact, and the MISFET being formed over the same semiconductor substrate, wherein
    said switch has an insulator formed between said cantilever beam and said fixed contact,
    a current path is formed in said insulator by modification of said insulator through a dielectric breakdown caused mechanical contact of said insulator, said cantilever beam and said fixed contact, and
    a multilevel interconnect layer is formed over said semiconductor substrate and said switch is formed in said multilevel interconnect layer.

2. The semiconductor device according to claim 1, wherein said cantilever beam and said fixed contact are surrounded by a frame body and there is a cavity inside of said frame body.

3. The semiconductor device according to claim 1, wherein said switch further comprises a pull-in electrode and said cantilever beam is moved by applying a predetermined voltage between said pull-in electrode and said cantilever beam to bring said cantilever beam into a contact state or a non-contact state with said fixed contact.

4. The switch according to claim 1, wherein said insulator is formed at said fixed contact.

5. The switch according to claim 1, wherein said insulator is formed at said cantilever beam.

6. The switch according to claim 1, wherein said insulator is formed at both said cantilever beam and said fixed contact.

7. The switch according to claim 1, wherein a convex shaped protruding part is formed at said cantilever beam.

8. The switch according to claim 1, wherein the breakdown voltage determined by the product of the film thickness of said insulator and the breakdown field strength of said insulator is within twice the voltage value which can be applied to a pull-in circuit of said switch.

9. The switch according to claim 1, wherein the thickness of said insulator is 1 nm or more and 100 nm or less.

10. The switch according to claim 1, wherein the thickness of said insulator is 1 nm or more and 25 nm or less.

11. The switch according to claim 1, wherein said insulator consists of an oxide system ceramic.

12. The switch according to claim 1, wherein said insulator consists of one selected from a group of an aluminum oxide film, a tantalum oxide film, a silicon oxide film, a niobium oxide film, and a silicon nitride film.

* * * * *

UNITED STATES PATENT AND TRADEMARK OFFICE
CERTIFICATE OF CORRECTION

PATENT NO. : 7,667,559 B2
APPLICATION NO. : 11/472355
DATED : February 23, 2010
INVENTOR(S) : Yamanaka et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 261 days.

Signed and Sealed this

Seventh Day of December, 2010

David J. Kappos
*Director of the United States Patent and Trademark Office*